(12) United States Patent
Watanabe et al.

(10) Patent No.: US 9,053,401 B2
(45) Date of Patent: Jun. 9, 2015

(54) LAMINATING SYSTEM, IC SHEET, SCROLL OF IC SHEET, AND METHOD FOR MANUFACTURING IC CHIP

(75) Inventors: Ryosuke Watanabe, Kanagawa (JP); Naoto Kusumoto, Kanagawa (JP); Osamu Nakamura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 1920 days.

(21) Appl. No.: 11/631,688

(22) PCT Filed: Jul. 28, 2005

(86) PCT No.: PCT/JP2005/014254
§ 371 (c)(1),
(2), (4) Date: Jan. 5, 2007

(87) PCT Pub. No.: WO2006/011665
PCT Pub. Date: Feb. 2, 2006

(65) Prior Publication Data
US 2008/0042168 A1     Feb. 21, 2008

(30) Foreign Application Priority Data

Jul. 30, 2004 (JP) ................... 2004-224789

(51) Int. Cl.
*H01L 27/10* (2006.01)
*B29C 65/00* (2006.01)
(Continued)

(52) U.S. Cl.
CPC .......... *G06K 19/077* (2013.01); *B32B 37/0053* (2013.01); *B32B 37/226* (2013.01);
(Continued)

(58) Field of Classification Search
CPC .......... G06K 19/07718; G06K 19/077; G06K 17/0025; H01L 27/1214; H01L 27/1266; H01L 2924/19041; H01L 2924/00; H01L 2224/48091; H01L 2924/01047; H01L 2924/01015; H01L 2224/45147; H01L 2924/0002; H01L 2924/3025; B32B 2305/342; B32B 2425/00; B32B 37/0035; B32B 37/226; B32B 2519/02; H01Q 1/36; H01Q 1/38
USPC ........................................ 156/247
See application file for complete search history.

(56) References Cited

U.S. PATENT DOCUMENTS 3,785,895 A * 1/1974 Ettre et al. ................. 156/89.12
4,226,526 A * 10/1980 Spence-Bate et al. .......... 355/53
(Continued)

FOREIGN PATENT DOCUMENTS

EP  0 866 494 A1  9/1998
JP  08-254686     10/1996
(Continued)

OTHER PUBLICATIONS

International Search Report (Application No. PCT/JP2005/014254; PCT8057) Dated Nov. 1, 2005.
(Continued)

*Primary Examiner* — Philip Tucker
*Assistant Examiner* — Vicki Wu
(74) *Attorney, Agent, or Firm* — Nixon Peabody LLP; Jeffrey L. Costellia

(57) ABSTRACT

Thin film integrated circuits are peeled from a substrate and the peeled thin film integrated circuits are sealed, efficiently in order to improve manufacturing yields. The present invention provides laminating system comprising transporting means for transporting a substrate provided with a plurality of thin film integrated circuits; first peeling means for bonding first surfaces of the thin film integrated circuits to a first sheet member to peel the thin film integrated circuits from the substrate; second peeling means for bonding second surfaces of the thin film integrated circuits to a second sheet member to peel the thin film integrated circuits from the first sheet member; and sealing means for interposing the thin film integrated circuits between the second sheet member and a third sheet member to seal the thin film integrated circuit with the second sheet member and the third sheet member.

14 Claims, 15 Drawing Sheets

(51) Int. Cl.
- *B32B 37/00* (2006.01)
- *G06K 19/077* (2006.01)
- *B32B 37/22* (2006.01)
- *H01L 23/00* (2006.01)
- *H01L 27/12* (2006.01)

(52) U.S. Cl.
CPC ....... *B32B2425/00* (2013.01); *G06K 19/07718* (2013.01); *H01L 24/86* (2013.01); *H01L 27/1214* (2013.01); *H01L 27/1266* (2013.01); *H01L 2224/7965* (2013.01); *H01L 2924/01002* (2013.01); *H01L 2924/01004* (2013.01); *H01L 2924/01005* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01042* (2013.01); *H01L 2924/01049* (2013.01); *H01L 2924/01056* (2013.01); *H01L 2924/0106* (2013.01); *H01L 2924/01073* (2013.01); *H01L 2924/01074* (2013.01); *H01L 2924/01079* (2013.01); *H01L 2924/01082* (2013.01); *H01L 2924/04953* (2013.01); *H01L 2924/09701* (2013.01); *H01L 2924/14* (2013.01); *H01L 2924/19041* (2013.01); *H01L 2924/01006* (2013.01); *H01L 2924/01024* (2013.01); *H01L 2924/01041* (2013.01)

(56) References Cited

U.S. PATENT DOCUMENTS

| | | | |
|---|---|---|---|
| 4,631,110 A * | 12/1986 | Tsumura et al. | 156/718 |
| 4,743,334 A | 5/1988 | Singer | |
| 5,470,411 A * | 11/1995 | Gloton et al. | 156/64 |
| 5,757,456 A | 5/1998 | Yamazaki et al. | |
| 5,821,138 A | 10/1998 | Yamazaki et al. | |
| 6,118,502 A | 9/2000 | Yamazaki et al. | |
| 6,248,199 B1 * | 6/2001 | Smulson | 156/244.12 |
| 6,342,434 B1 | 1/2002 | Miyamoto et al. | |
| 6,376,333 B1 | 4/2002 | Yamazaki et al. | |
| 6,573,158 B2 | 6/2003 | Miyamoto et al. | |
| 6,589,855 B2 | 7/2003 | Miyamoto et al. | |
| RE38,466 E | 3/2004 | Inoue et al. | |
| 7,050,138 B1 | 5/2006 | Yamazaki et al. | |
| 2002/0034860 A1 | 3/2002 | Miyamoto et al. | |
| 2002/0048907 A1 | 4/2002 | Miyamoto et al. | |
| 2003/0071953 A1 | 4/2003 | Yamazaki et al. | |
| 2003/0188831 A1 | 10/2003 | Sasaki et al. | |
| 2004/0164302 A1 * | 8/2004 | Arai et al. | 257/72 |
| 2005/0070038 A1 | 3/2005 | Yamazaki et al. | |

FOREIGN PATENT DOCUMENTS

| | | |
|---|---|---|
| JP | 10-125929 | 5/1998 |
| JP | 10-236042 | 9/1998 |
| JP | 2001-260580 | 9/2001 |
| JP | 2001-277726 | 10/2001 |
| JP | 2001-277726 A | 10/2001 |
| JP | 2001-358198 | 12/2001 |
| JP | 2002-083275 | 3/2002 |
| JP | 2002083275 A * | 3/2002 |
| JP | 2002-342728 | 11/2002 |
| JP | 2003-203898 | 7/2003 |
| JP | 2003-324142 | 11/2003 |
| JP | 2003-346114 | 12/2003 |
| JP | 2004-094492 | 3/2004 |
| JP | 2004-094590 | 3/2004 |
| JP | 2004094590 A * | 3/2004 |
| JP | 2004-118255 | 4/2004 |
| JP | 2004-118255 A | 4/2004 |
| WO | WO 2005/119781 A1 | 12/2005 |

OTHER PUBLICATIONS

Written Opinion (Application No. PCT/JP2005/014254; PCT8057) Dated Nov. 1, 2005.

* cited by examiner

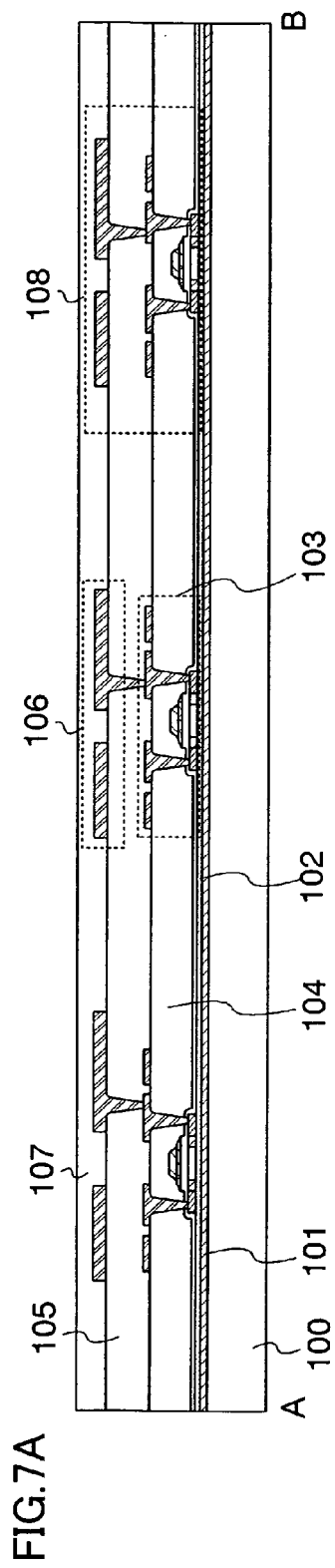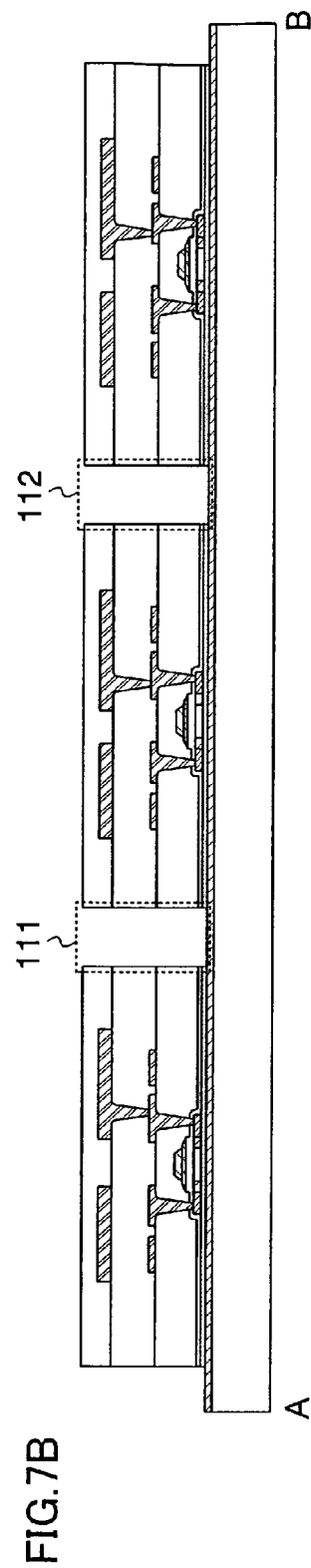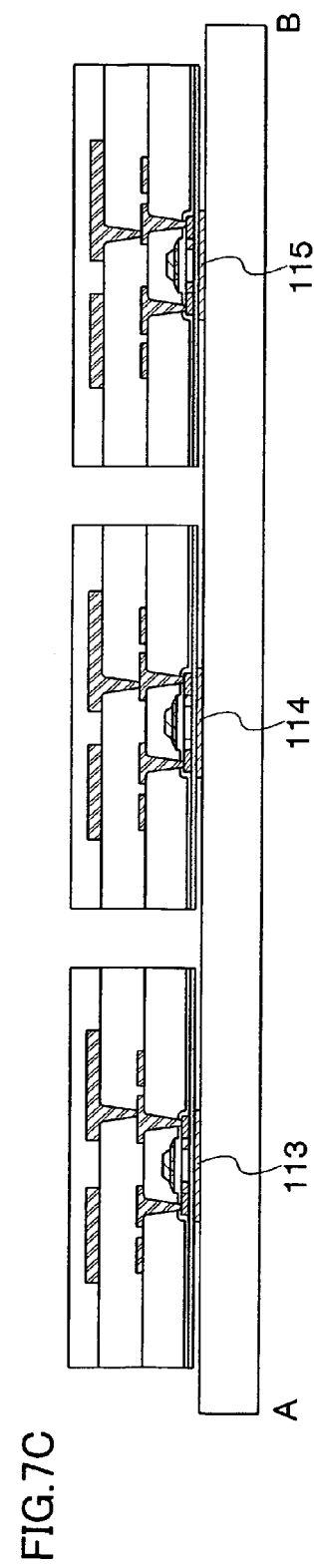

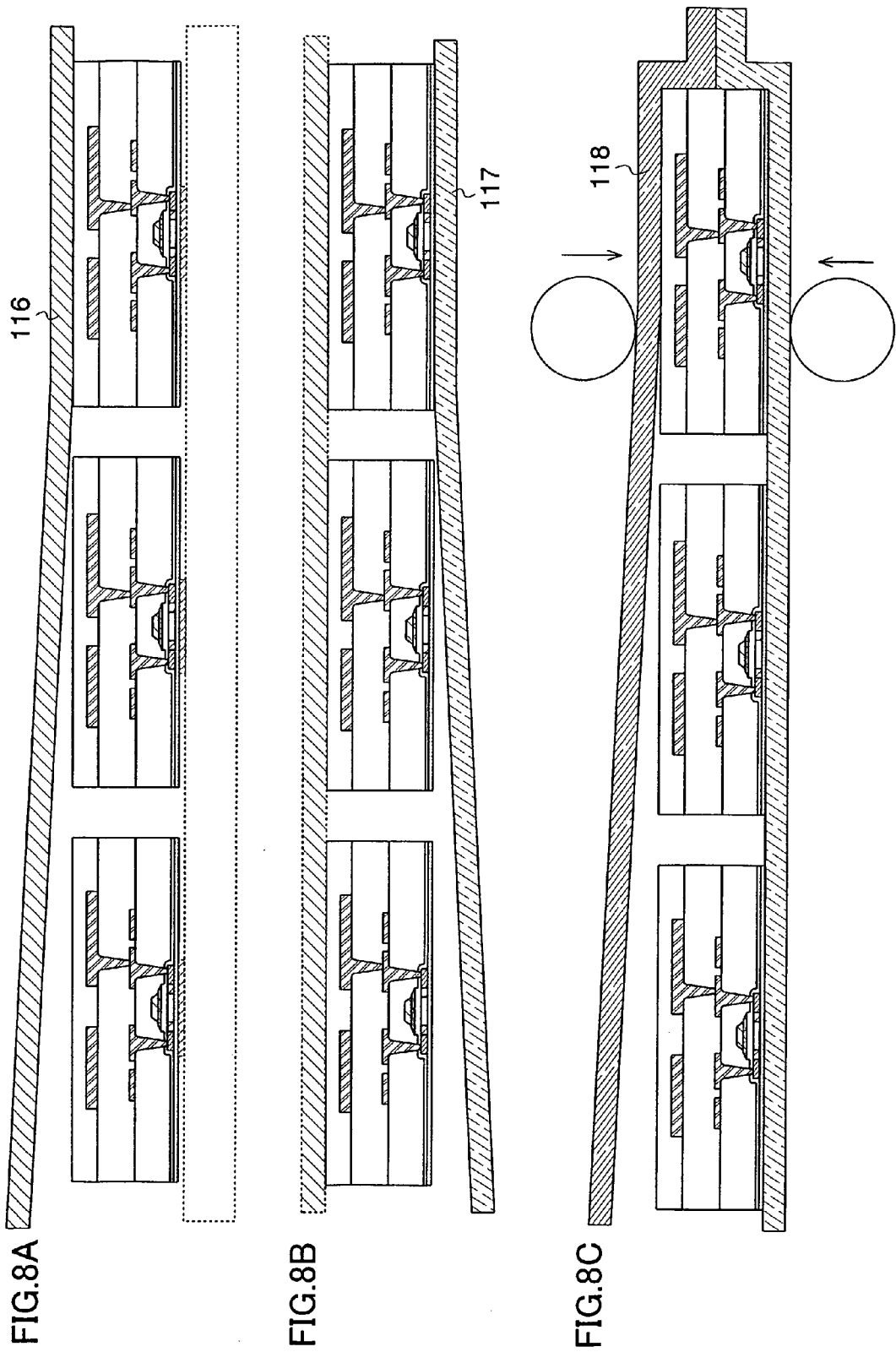

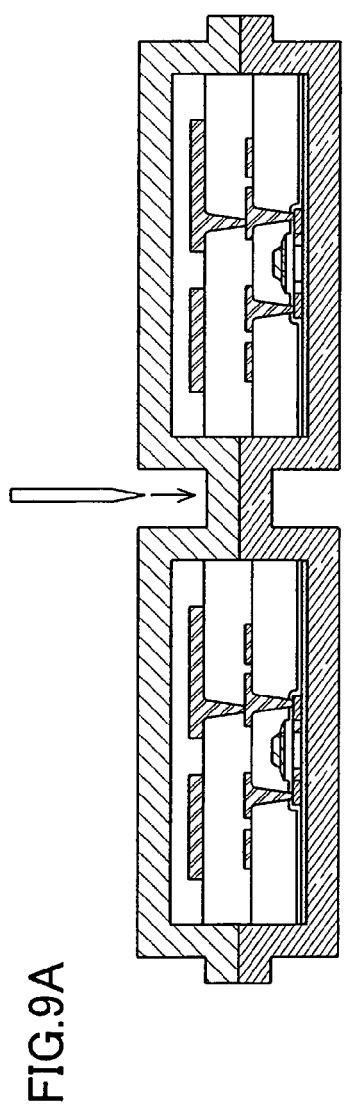
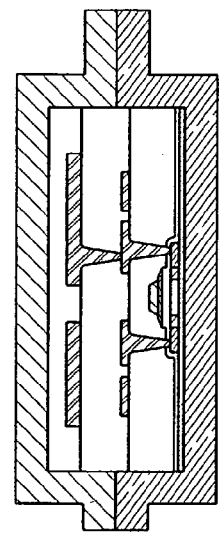
FIG.9A
FIG.9B 100  104  101

LAMINATING SYSTEM, IC SHEET, SCROLL OF IC SHEET, AND METHOD FOR MANUFACTURING IC CHIP

TECHNICAL FIELD

The present invention relates to a laminating system for peeling and sealing thin film integrated circuits provided over a substrate, an IC sheet including a plurality of sealed thin film integrated circuits, a scroll of an IC sheet including a plurality of sealed thin film integrated circuits, and a method for manufacturing an IC chip which seals thin film integrated circuits.

BACKGROUND ART

In recent years, the necessity of an IC chip mounted card or an IC chip mounted tag which can transmit data out of touch has been grown in a field which needs automatic recognition such as securities and commodity management. The IC chip mounted card reads and writes data to/from an external device via a loop antenna in the card. The IC chip mounted card has larger memory capacity and higher security than those of a magnetic card that records data by a magnetic encoding method. Hence, it has been proposed that a form of the IC mounted card capable of being applied to various fields. (For example, refer to Patent document 1.)

Generally, an IC chip is formed by a silicon wafer. In recent years, technological development of an IC chip using a thin film integrated circuit provided over a glass substrate (an IC tag, an ID tag, a RF tag (Radio Frequency), a wireless tag (also referred to as an electric tag)) has been promoted for reduction in cost. According to such the technology, the thin film integrated circuit provided over the glass substrate is required to separate from the glass substrate which is a support substrate after being completely manufactured. Therefore, various techniques have been contrived as a method for separating the thin film integrated circuit provided over the support substrate.

For example, as a method for peeling the thin film integrated circuit provided over the support substrate, there is the technique by which a peeling layer made from amorphous silicon (or polysilicon) is formed and hydrogen included in the amorphous silicon is released by laser irradiation to produce empty spaces to separate the support substrate from the peeling layer (Patent document 2). Alternatively, there is the technique by which a peeling layer containing silicon is formed between a thin film integrated circuit and a support substrate, and the peeling layer is removed with gas containing halogen fluoride to separate the thin film integrated circuit from the support substrate (Patent document 3).

Patent document 1: Unexamined patent publication No. 2001-260580

Patent document 2: Unexamined patent publication No. 10-125929

Patent document 3: Unexamined patent publication No. 8-254686

However, in the case that a plurality of thin film integrated circuits are formed over a substrate, the plurality of the thin film integrated circuits are separated from the substrate individually by removing the peeling layer. When the separated thin film integrated circuits are respectively sealed by laminate treatment or the like, manufacturing efficiency is deteriorated. Since the separated thin film integrated circuits are thin and lightweight, it is extremely difficult to seal them without damaging or breaking.

From the point of view of production efficiency, peeling and sealing processes for thin film integrated circuits provided over a substrate are carried out in succession by using a sequence of equipment. Generally, the sealing process by a laminate processing is carried out with a film having strong adhesion force such as a hot melt film in consideration of strength and reliability after sealing. Hence, when peeling process for the thin film integrated circuits is also carried out with a film having strong adhesion force, peeling of the thin film integrated circuits may be failed because the film may adhere to the substrate. As a result, there arises a problem that manufacturing yields are deteriorated. In the case that the peeling and sealing processes for thin film integrated circuits are carried out with a film having weak adhesion, the thin film integrated circuits can be effectively peeled from the substrate; however, there arises a problem in reliability of sealed thin film integrated circuits.

DISCLOSURE OF INVENTION

In view of the foregoing, it is an object of the present invention to prevent deterioration of manufacturing efficiency when sealing thin film integrated circuits and to prevent damage and destruction of the thin film integrated circuits. Further, it is another object of the present invention to peel the thin film integrated circuits from a substrate and seal the peeled thin film integrated circuits and to improve manufacturing yields.

One embodiment of the present invention provides a laminating system comprising transporting means for transporting a substrate provided with a plurality of thin film integrated circuits; first peeling means for bonding first surfaces of the thin film integrated circuits to a first sheet member to peel the thin film integrated circuits from the substrate; second peeling means for bonding second surfaces opposed to the first surfaces of the thin film integrated circuits to a second sheet member to peel the thin film integrated circuits from the first sheet member; and sealing means for interposing the thin film integrated circuits between the second sheet member and a third sheet member to seal the thin film integrated circuits with the second sheet member and the third sheet member.

Another embodiment of the present invention provides a laminating system comprising transporting means for transporting a substrate provided with a plurality of thin film integrated circuits; a first supply roller wounded with a first sheet member; first peeling means for bonding first surfaces of the thin film integrated circuits to the first sheet member to peel the thin film integrated circuits from the substrate; a second supply roller wounded with a second sheet member; second peeling means for bonding second surfaces opposed to the first surfaces of the thin film integrated circuits to a second sheet member to peel the thin film integrated circuits from the first sheet member; a third supply roller wounded with a third sheet member; sealing means for interposing the thin film integrated circuits between the second sheet member and the third sheet member to seal the thin film integrated circuits with the second sheet member and the third sheet member; and a receiving roller for winding the thin film integrated circuits which are sealed with the second sheet member and the third sheet member.

More another embodiment of the present invention provides a laminating system comprising a substrate provided with a plurality of thin film integrated circuits; a first supply roller wounded with a first sheet member; fixating and moving means for fixating the substrate so that one surface of the substrate is opposite to the first sheet member and for moving the substrate so that the plurality of thin film integrated circuits and the first sheet member are bonded together; first peeling means for bonding first surfaces of the thin film integrated circuits to the first sheet member to peel the thin film integrated circuits from the substrate; a second supply roller wounded with a second sheet member; second peeling means for bonding second surfaces opposed to the first surfaces of the thin film integrated circuits to the second sheet member to peel the thin film integrated circuits from the first sheet member; a third supply roller wounded with a third sheet member which bonds to the first surfaces of the thin film integrated circuits; sealing means for sealing the thin film integrated circuits with the second sheet member and the third sheet member; and a receiving roller for winding the thin film integrated circuits which are sealed with the second sheet member and the third sheet member.

In the laminating system having the foregoing embodiments, the sealing means has at least two rollers provided so as to be opposed to each other. Either or both of the two rollers has a heating means. The sealing means passes the thin film integrated circuits through the two rollers and seals the thin film integrated circuits by performing either or both of a pressure treatment and a heating treatment.

Further more another embodiment of the present invention provides a laminating system comprising transporting means for transporting a substrate provided with a plurality of thin film integrated circuits; a first supply roller wounded with a first sheet member; first peeling means for bonding first surfaces of the thin film integrated circuits to the first sheet member to peel the thin film integrated circuits from the substrate; a second supply roller wounded with a second sheet member; second peeling means for bonding second surfaces opposed to the first surfaces of the thin film integrated circuits to a second sheet member to peel the thin film integrated circuits from the first sheet member; means for supplying resin in a heated and melted state by squeezing onto the first surfaces of the thin film integrated circuits; sealing means for sealing the thin film integrated circuits with the second sheet member and the resin; and a receiving roller for winding the thin film integrated circuits which are sealed with the second sheet member and the resin. In that case, the sealing means has at least two rollers provided so as to be opposed to each other, and either or both of the two rollers has a cooling means. The sealing means passes the thin film integrated circuits through the two rollers and seals the thin film integrated circuits by performing either or both of a pressure treatment and a heating treatment.

In the laminating system according to the present invention, the first peeling means and the second peeling means have rollers. Further, the second peeling means has at least two rollers so as to be opposed to each other, passes the thin film integrated circuits through the two rollers, and seals the thin film integrated circuits by performing either or both of a pressure treatment and a heating treatment.

The first sheet member has at least one side with an adhesive property. The second sheet member and the third sheet member are laminate films.

The present invention provides an IC sheet which is formed by forming a plurality of sealed thin film integrated circuits into a sheet to make it easier for the IC sheet to be used. The IC sheet according to the present invention is composed of two sheet members of a second sheet member and a third sheet member which seal a plurality of the thin film integrated circuits therebetween.

The present invention provides a scroll of an IC sheet which is formed by winding an IC sheet including a plurality of thin film integrated circuits sealed with two sheet members to make it easier for the scroll of an IC sheet to be used. The scroll of an IC sheet according to the present invention is formed by winding an IC sheet obtained by sealing the plurality of thin film integrated circuit between the two sheet members of the second sheet member and the third sheet member.

In the IC sheet or a scroll of an IC sheet having the foregoing embodiments, each of a plurality of the thin film integrated circuits has a plurality of thin film transistors and a conductive layer serving as an antenna, and each of the plurality of thin film integrated circuits is regularly arranged.

A method for manufacturing an IC chip comprises the steps of forming a peeling layer over a substrate having an insulating surface; forming a plurality of thin film integrated circuits over the substrate; forming an opening portion at a boundary between the thin film integrated circuits to expose the peeling layer; introducing gas or liquid containing halogen fluoride into the opening portion to remove the peeling layer; bonding first surfaces of the thin film integrated circuits to a first sheet member to peel a plurality of the thin film integrated circuits from the substrate; bonding second surfaces opposed to the first surfaces of the thin film integrated circuits to a second sheet member to peel the thin film integrated circuits from the first sheet member; bonding the first surfaces of the thin film integrated circuits to a third sheet member to seal the thin film integrated circuits with the second sheet member and the third sheet member. Further, a plurality of thin film transistors and a conductive layer serving as an antenna are formed as the thin film integrated circuits over the substrate.

BRIEF DESCRIPTION OF DRAWINGS

FIGS. 7A to 7C are views for showing a method for manufacturing an IC chip according to the present invention;

FIGS. 8A to 8C are views for showing a method for manufacturing an IC chip according to the present invention;

FIGS. 9A and 9B are views for showing a method for manufacturing an IC chip according to the present invention;

BEST MODE FOR CARRYING OUT THE INVENTION

Figure 1:
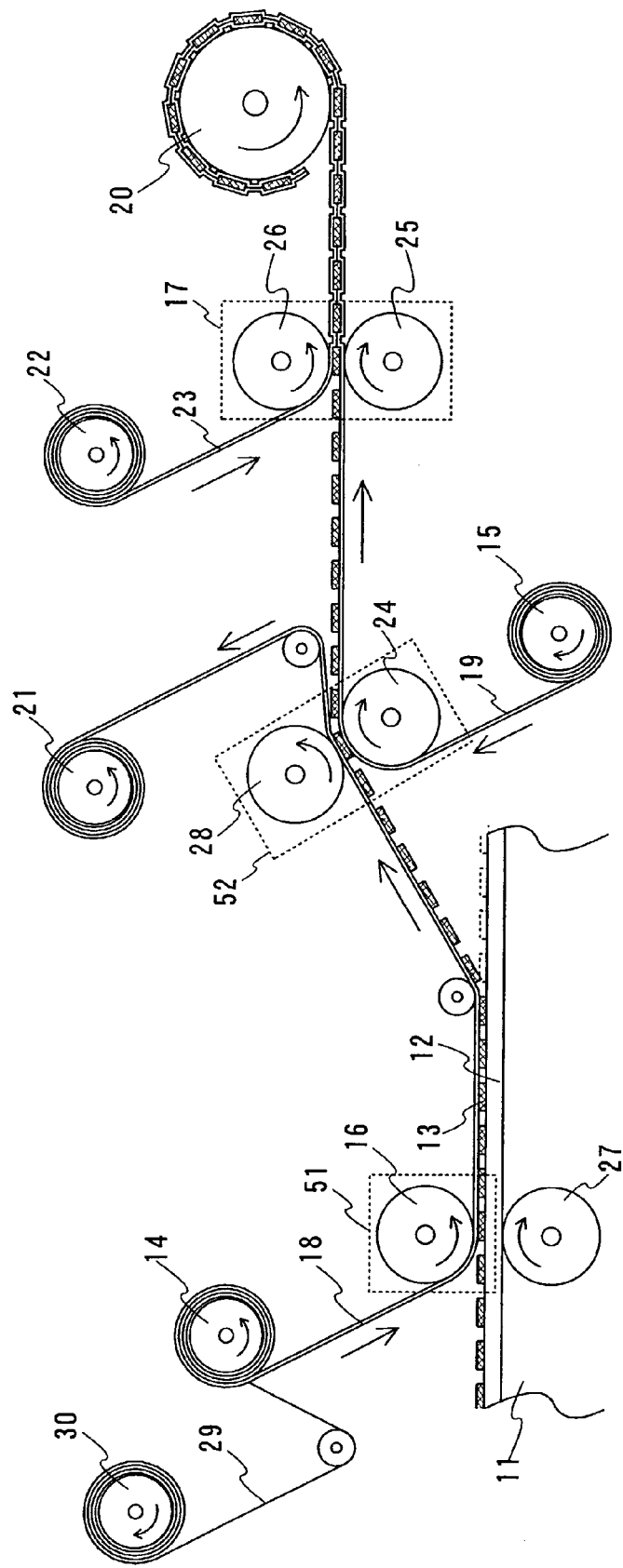
FIG. 1 is a view for showing a laminating system according to the present invention.

The above and further objects and novel features of the invention will more fully appear from the following details description when the same is read in connection with the accompanying drawings. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein. Through the drawings of the embodiments, like components are denoted by like numerals as of the first embodiment and will not be further explained.

The present invention provides a laminating system which continuously peels thin film integrated circuits provided over a substrate and seals the peeled thin film integrated circuits. According to the present invention, a plurality of thin film integrated circuits provided over a substrate is bonded to a first sheet member to be peeled from the substrate, and the thin film integrated circuits bonded to the first sheet member is bonded to a second sheet member to be peeled once again from the first sheet member, then, a third sheet member is bonded to a surface opposite to the surface bonded with the second sheet member, and then, the thin film integrated circuit is sealed with the second sheet member and the third sheet member by a sealing means. That is, peeling of the thin film integrated circuits is performed twice in a process of a series of the peeling and the sealing.

The first sheet member is used to peel the thin film integrated circuits provided over the substrate. The second sheet member is used to peel the thin film integrated circuits from the first sheet member and serves as a laminate film for sealing the thin film integrated circuits with the third sheet member. The reason that the peeling is performed twice is that the laminate film for sealing has so strong adhesive force that the thin film integrated circuits provided over the substrate cannot be efficiently peeled from the substrate since the laminate film adheres not only to the thin film integrated circuits but also to the substrate. Therefore, the first sheet member with a weak adhesive surface is used to peel the thin film integrated circuits over the substrate and the second sheet member formed by a laminated film or the like is used to peel again the thin film integrated circuits from the first sheet member.

According to the present invention, the laminated film used as the second or third sheet member may be any film as long as it can be used for laminating. For example, a material such as polypropylene, polystyrene, polyester, vinyl, polyvinyl fluoride, vinyl chloride, methyl methacrylate, nylon, or polycarbonate can be used as the laminate film. The second or third sheet member has one adhesive surface. The adhesive surface may be coated with an adhesive agent such as thermosetting resin, ultraviolet curing resin, an epoxy resin adhesive agent, a photocuring adhesive agent, a moisture curing adhesive agent, or a resin addition agent.

The present invention includes an IC sheet formed by sealing a plurality of thin film integrated circuits to have a sheet-like shape or an IC scroll formed by winding an IC sheet having a plurality of thin film integrated circuits.

According to the present invention, an IC chip can be manufactured by forming thin film integrated circuits over a substrate via a peeling layer, and removing the peeling layer to peel the thin film integrated circuits from the substrate, then, sealing the thin film integrated circuits.

Hereinafter, a laminating system for continuously peeling and sealing a plurality of thin film integrated circuits over a substrate, an IC sheet having the sealed plurality of thin film integrated circuits, and a manufacturing method for a scroll of the IC sheet and an IC chip are specifically explained with reference to the drawings.

Embodiment 1

In this embodiment, a main form of a laminating system for continuously performing processes of peeling thin film integrated circuits from a substrate and sealing the peeled thin film integrated circuits will be hereinafter explained.

The laminating system according to this embodiment has a transporting means 11 for transporting a substrate 12 provided with a plurality of thin film integrated circuits 13, a first supply roller 14 winded with a first sheet member 18, a first peeling means 51 provided with a roller 16 for bonding the thin film integrated circuits 13 to the first sheet member 18 to peel the thin film integrated circuits 13 from the substrate 12, a second supply roller 15 winded with a second sheet member 19, a second peeling means 52 provided with rollers 24, 28 for bonding the thin film integrated circuits 13 to a second sheet member 19 to peel the thin film integrated circuits 13 from the first sheet member 18, a receiving roller 21 for collecting the first sheet member 18, a third supply roller 22 for supplying a third sheet member 23, a sealing means 17 for sealing the thin film integrated circuits 13 with the second sheet member 19 and the third sheet member 23, and a receiving roller 20 for winding the sealed thin film integrated circuits 13.

In the system illustrated in FIG. 1, the first sheet member 18 supplied from the first supply roller 14 is bonded to the thin film integrated circuits 13 over the substrate 12 transported by the transporting means 11 to peel the thin film integrated circuits 13 from the substrate 12 with the first peeling means 15 provided with the roller 16. Thereafter, the peeled thin film integrated circuits 13 are bonded to the first sheet member 18 to pass through the roller 28. The second sheet member 19 supplied from the second supply roller 15 passes through the roller 24.

The second sheet member 19 is bonded to the opposite side of the transported thin film integrated circuits 13 which is bonded to the first sheet member 18 to peel the thin film integrated circuits 13 from the first sheet member 18 by the second peeling means 52 provided with the rollers 24, 28. Either or both of pressure treatment and heat treatment is carried out when bonding the thin film integrated circuits 13 bonded to the first sheet member 18 to the second sheet member 19. Thereafter, the peeled thin film integrated circuits 13 are bonded to the second sheet member 19 and passed through the sealing means 17. Further, the third sheet member 23 supplied from the third supply roller 22 passes through the sealing means 17.

The sealing means 17 bonds a side opposite to the side of the transported thin film integrated circuits 13 bonded to the second sheet member 19 (the side opposite to the side bonded to the second sheet 19) to the third sheet member 23. Simultaneously, either or both of pressure treatment and heat treatment are carried out. Thereafter, the sealed thin film integrated circuits 13 pass through the receiving roller 20 and wind around the receiving roller 20.

In the laminating system illustrated in FIG. 1, as noted above, the first sheet member 18 is supplied from the first supply roller, and passed through the roller 16 and the roller 28 included in the first peeling means sequentially, then, collected by the receiving roller 21. The first supply rollers 14 and the rollers 16, 28 are spun to the same directions. The second sheet member 19 is supplied from the second supply roller 15, and passed through the roller 24 included in the second peeling means and the roller 25 included in the sealing means 17 sequentially, then, collected by the receiving roller 20. The second supply roller 15 and the rollers 24, 25 are spun to the same directions. The third sheet member 23 is supplied from the third supply roller 22, and passed through the roller 26 included in the sealing means 17, then, collected by the receiving roller 20. The third supply roller 22 and the roller 26 are spun to the same directions.

The transporting means 11 transports the substrate 12 provided with a plurality of the thin film integrated circuits 13. In FIG. 1, the transporting means 11 has a roller 27. The substrate 12 is transported by spinning the roller 27. The transporting means 11 may have any structure as long as it can transport the substrate 12. For example, a belt conveyor, a plurality of rollers, a robot arm, or the like can be used as the transporting means 11. The robot arm transports the substrate 12 or a stage provided with the substrate 12. Further, the transporting means 11 transports the substrate 12 at predetermined speed in accordance with the transporting speed of the first sheet member 18.

The first sheet member 18, the second sheet member 19, and the third sheet member 23 respectively wind around the first supply roller 14, the second supply roller 15, and the third supply roller 22. The first sheet member 18 is moved toward the roller 28 included in the second peeling means at predetermined speed by spinning the first supply roller 14 at predetermined speed. Each of the second sheet member 19 and the third sheet member 23 is moved toward the sealing means 17 at predetermined speed by spinning the second supply roller 15 and the third supply roller 22 at predetermined speed. The first supply roller 14, the second supply roller 15, and the third supply roller 22 are in columnar shapes and made from a resin material, a metal material, a rubber material, or the like.

The first sheet member 18 is formed by a flexible film and has at least one surface with an adhesive property. Specifically, the adhesive surface is prepared by providing an adhesive agent on a base film used as a base material such as polyester. As the adhesive agent, a resin material or a synthetic rubber material containing acrylic resin or the like can be used. Further, a film having weak adhesive force (preferably, 0.01 to 1.0 N, more preferably, 0.05 to 0.75 N, more preferably, 0.15 to 0.5 N) is preferably used as the first sheet member 18 in order to bond the thin film integrated circuits again to the second sheet member to peel the first sheet member from the thin film integrated circuits after bonding the thin film integrated circuits provided over the substrate to the first sheet member. The thickness of the adhesive agent may be 1 to 100 $\mu$m, preferably, 5 to 50 $\mu$m, more preferably, 10 to 30 $\mu$m. Preferably, the base film is formed by a polyester film or the like with a thickness of 10 $\mu$m to 1 mm, preferably, 25 to 200 $\mu$m, more preferably, 50 to 100 $\mu$m for easy handling in processing.

As the first sheet member, a UV (ultraviolet) peeling film, a thermal peeling film, or the like can be used in addition to the foregoing materials. The UV peeling film is prepared by forming an adhesive layer made from a resin material which loses its adhesive force by UV irradiation over the base film. The thermal peeling film is prepared by forming an adhesive layer made from a resin material which loses its adhesive force by heat over the base film.

In the case that the surface of the adhesive layer is protected by a separator, a separator receiving roller 30 is provided as illustrated in FIG. 1 to remove the separator 29 in use. Further, a base film subjected to antistatic treatment used as the base material can be used as the separator. The separator is formed by a film or a paper made from polyester or the like. The separator is preferably formed by a film made from polyethylene terephthalate or the like since there can be no paper powder in patterning.

The second sheet member 19 and the third sheet member 23 are formed by flexible films, for example, a laminate film, a paper made from a fibrous material, or the like. The laminate film means films in general which can be used for laminate treatment. The laminate film is made from a material such as polypropylene, polystyrene, polyester, vinyl, polyvinyl fluoride, vinyl chloride, methyl methacrylate, nylon, polycarbonate, or the like, and the surface of the laminate film may be subjected to processing treatment such as embossing.

In this embodiment, the thin film integrated circuits are preferably sealed with a hot melt adhesive. The hot melt adhesive is a chemical substance which does not contain water or a fluxing material, which is made from a nonvolatile thermoplastic material being solid in a room temperature, and which bonds things together by being coated in a melting state to be cooled. The hot melt adhesive has advantages of being unstuck easily, nonpolluting, safe, clean, energy-saving, and low cost.

Since the hot melt adhesive is solid at normal temperature, the hot melt adhesive which is formed to be a film or fibrous in advance, or which is formed to be a film by forming an adhesive layer over a base film made from polyester or the like can be used. Here, a sheet member prepared by forming a hot melt film over a base film made from polyethylene terephthalate is used. The hot melt film is made from resin having a lower softening point than that of the base film, and melted into a rubber state when being applied with heat to be bonded and hardened when being cooled. As the hot melt film, a film mainly containing, for example, ethylene-vinyl acetate copolymer (EVA) series, polyester series, polyamide series, thermoplastic elastomer series, polyolefin series, or the like can be used.

Either or both of the second sheet member 19 and the third sheet member 23 may have one adhesive surface. The adhesive surface can be prepared by coating either surface of either or both of the second sheet member 19 and the third sheet member 23 with thermosetting resin, ultraviolet curing resin, an epoxy resin adhesive agent, a photocuring adhesive agent, a moisture curing adhesive agent, or a resin addition agent.

Either or both of the second sheet member 19 and the third sheet member 23 may have a light transmitting property. In order to protect the thin film integrated circuits 13 to be sealed, either or both of the second sheet member 19 and the third sheet member 23 may be coated with a conductive material by charging static electricity. Either or both of the second sheet member 19 and the third sheet member 23 may be coated with a thin film mainly containing carbon (diamond like carbon film) or a conductive material such as indium tin oxide (ITO) as a protective film.

The first peeling means 51 has at least the roller 16 to bond either surfaces of the thin film integrated circuits 13 to either surface of the first sheet member 18 to peel the thin film integrated circuits 13 from the substrate 12. By spinning the roller 16, the thin film integrated circuits 13 are bonded to the first sheet member 18 to be peeled from the substrate 12. Therefore, the roller 16 is provided to be opposite to the side over which the thin film integrated circuits 13 are provided of the substrate 12. Further, the roller 16 is in a columnar shape and made from a resin material, a metal material, a rubber material, or the like, preferably, a soft material.

The second peeling means 52 has at least the rollers 24, 28 opposing to each other to bond the thin film integrated circuits 13 to either surface of the second sheet member 19 to peel the thin film integrated circuits 13 from the first sheet member 18. In that case, the thin film integrated circuits 13 are bonded to the second sheet member 19 which is supplied from the second supply roller 15 and is passed through the roller 24, simultaneously, either or both of pressure treatment and heat treatment is carried out by using either or both of the rollers 24, 28 when the second sheet member 19 passes through the rollers 24, 28.

According to this treatment, the thin film integrated circuits 13 bonded to the first sheet 18 is bonded to the second sheet member 19. As the heat treatment, any method as long as it can apply heat energy can be used. For example, warm media such as an oven, a heater of a heating wire, or oil; a hot stamp; a thermal head; laser light; an infrared flash; a heat stylus; or the like can be used. Further, the rollers 24, 28 are in columnar shapes and made from a resin material, a metal material, a rubber material, or the like, preferably, a soft material.

When the thin film integrated circuits 13 which is bonded to the second sheet member 19 at second surfaces of the thin film integrated circuits 13 is moved toward the sealing means 17, the sealing means 17 bonds the third sheet member 23 to the first surfaces of the thin film integrated circuits 13, simultaneously, the thin film integrated circuits 13 are sealed with the second sheet member 19 and the third sheet member 23. The sealing means 17 has the rollers 25, 26 opposing to each other. The other surface of the thin film integrated circuits 13 is bonded to the third sheet member 23 which is supplied from the third supply roller 22 and is passed through roller 26, simultaneously, either or both of pressure treatment and heat treatment is carried out by using the rollers 25, 26 when the third sheet member 23 passes between the rollers 25, 26. According to the treatment, the thin film integrated circuits 13 are sealed with the second sheet member 19 and the third sheet member 23.

Either or both of the rollers 25, 26 composing the sealing means 17 have a heating means. As the heating means, warm media such as an oven, a heater of a heating wire, or oil; a hot stamp; a thermal head; laser light; an infrared flash; a heat stylus; or the like can be used. The rollers 25, 26 are spun at predetermined speed in accordance with the spinning speed of the roller 24, the second supply roller 15, and the third supply roller 22. The rollers 25, 26 are in columnar shapes and made from a resin material, a metal material, a rubber material, or the like, preferably, a soft material.

The receiving roller 20 is a roller for winding and collecting the thin film integrated circuits 13 sealed with the second sheet member 19 and the third sheet member 23. The receiving roller 20 spins at predetermined speed in accordance with the spinning speed of the rollers 25, 26. The receiving roller 20 is in a columnar shape and made from a resin material, a metal material, a rubber material, or the like, preferably, a soft material.

As noted above, a plurality of the thin film integrated circuits 13 provided over the substrate 12 can be continuously peeled, sealed, and collected by the spin of the first to third supply rollers 14, 15, and 21, the rollers 16, 24, 28, 25, and 26, and the receiving roller 20. The system illustrated in FIG. 1 has high mass productivity and can improve manufacturing efficiency.

A laminating system which has a different form from that of the foregoing laminating system is explained with reference to FIG. 2.

Figure 2:
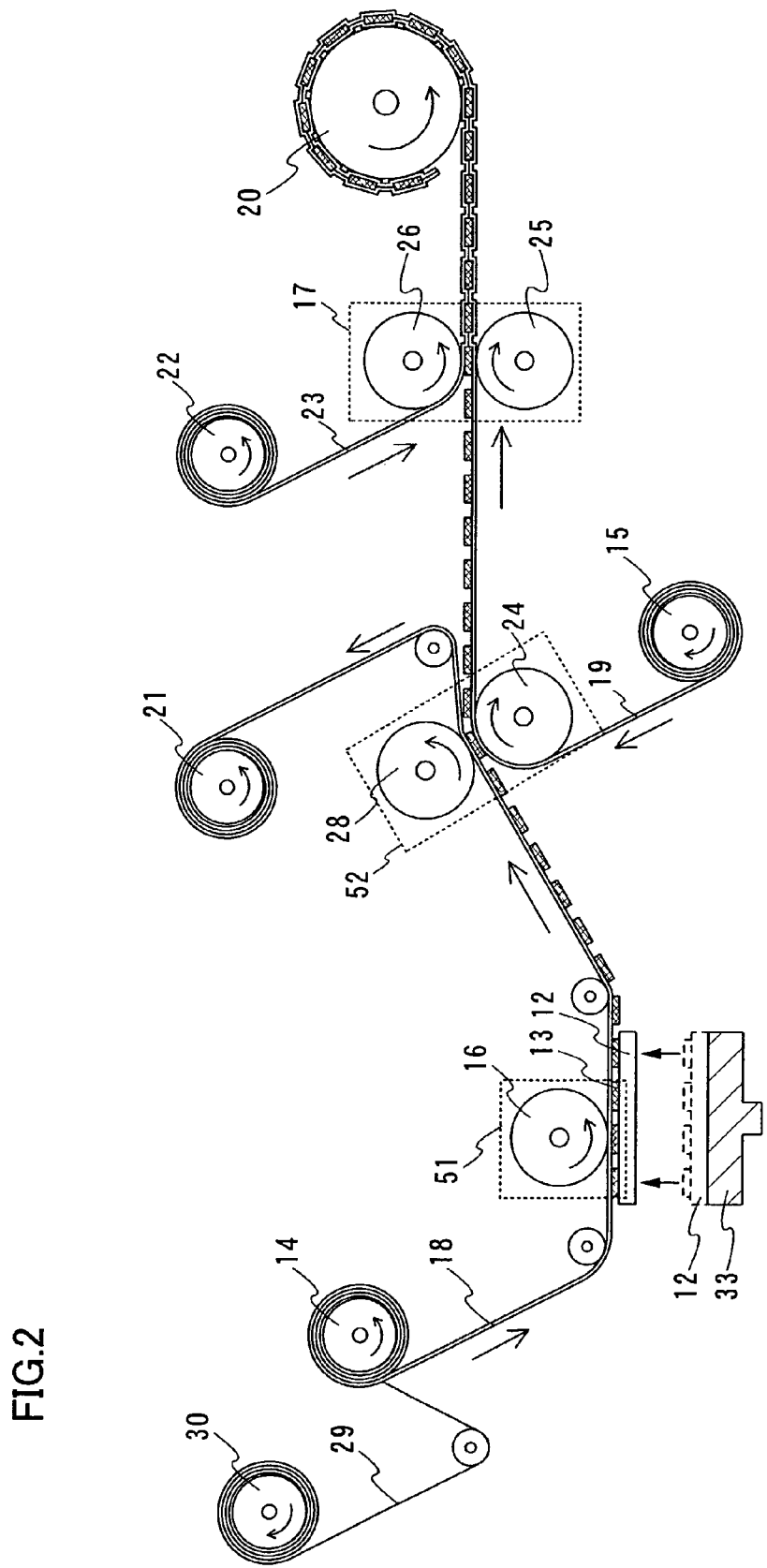
FIG. 2 is a view for showing a laminating system according to the present invention.

The laminating system illustrated in FIG. 2 has a fixating and moving means 33 for the substrate 12, a first peeling means 51 for peeling the thin film integrated circuits 13 from one surface of the substrate 12, a first supply roller 14 winded with a first sheet member 18, a second supply roller 15 winded with a second sheet member 19, a second peeling means 52 for peeling the thin film integrated circuits 13 from the first sheet member 18 and bonding the thin film integrated circuits 13 to the second sheet member 19, a sealing means 17 for sealing the thin film integrated circuits 13 between the second sheet member 19 and a third sheet member 23, and a receiving roller 20 for collecting the sealed thin film integrated circuits 13. The structure illustrated in FIG. 2 is newly added with the fixating and moving means 33 in FIG. 1.

In the system illustrated in FIG. 2, the first sheet member 18 which is supplied from the first supply roller 14 and which passes through a roller 16 is bonded with the substrate 12 by the fixating and moving means 33. Accordingly, the thin film integrated circuits 13 are bonded to the first sheet member 18 by the first peeling means 51 provided with the roller 16 to be peeled from the substrate 12. The first sheet member 18 bonded with the peeled thin film integrated circuits 13 is moved toward the roller 28. Further, the second sheet member 19 supplied from the second supply roller 15 is moved toward the roller 24. Then, the thin film integrated circuits 13 are sealed as illustrated in FIG. 1.

The fixating and moving means 33 serves to fix the substrate 12 so that the surface of the substrate 12 over which the thin film integrated circuits 13 are provided (hereinafter, either surface) is placed opposite to the first sheet member 18 and serves to move the substrate 12 to bond the thin film integrated circuits 13 to the first sheet member 18. The substrate 12 is moved by moving the fixating and moving means 33. As shown in FIG. 2, a means which processes the substrate 12 one-by-one, or a means which is composed of a cylindrical object or a polyhedron such as a rectangular object can be used as the fixating and moving means 33. In the case that a cylindrical or polyhedral fixating and moving means 33 is used, the substrate 12 is fixated to the side of the fixating and moving means 33 to be moved by spinning the cylindrical or polyhedral fixating and moving means 33.

As noted above, in the laminate system illustrated in FIG. 2, the thin film integrated circuits 13 can be continuously peeled, sealed, and collected by spinning the fixating and moving means 33, the first to third supply rollers, the rollers 16, 24, 28, 25, and 26, and the receiving roller 20. Therefore, mass productivity and manufacturing efficiency can be improved by using the laminate system illustrated in FIG. 2.

A laminating system which has a different form from that of the foregoing laminating system is explained with reference to FIG. 3.

Figure 3:
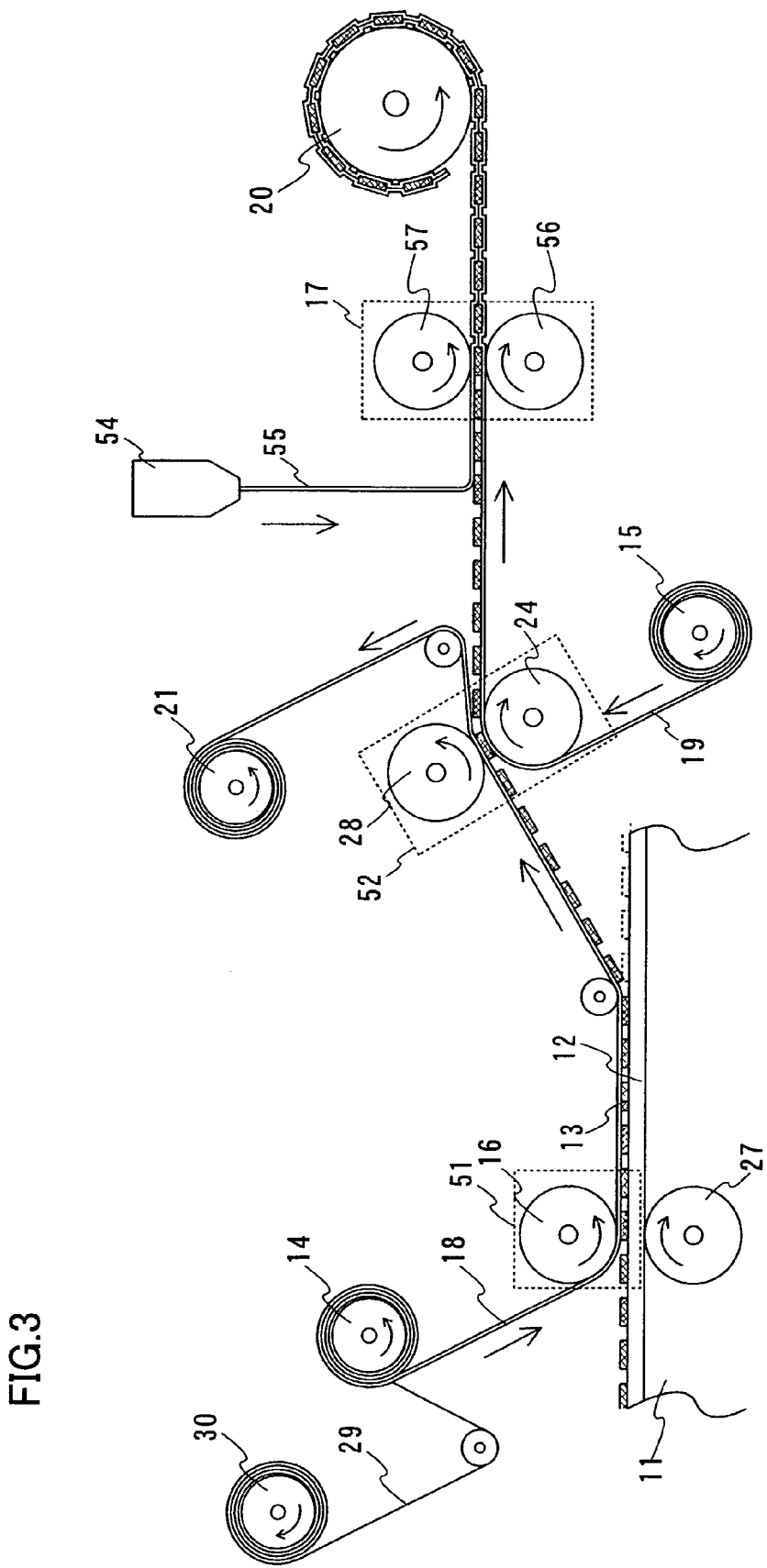
FIG. 3 is a view for showing a laminating system according to the present invention.

The laminating system illustrated in FIG. 3 has a transporting means 11 for transporting the substrate 12, a first peeling means 51 for peeling the thin film integrated circuits 13 from either surface of the substrate 12, a first supply roller 14 winded with the first sheet member 18, a second supply roller 15 winded with the second sheet member 19, a second peeling means 52 for peeling the thin film integrated circuits 13 from the first sheet member 18 and bonding the peeled thin film integrated circuits 13 to the second sheet member 19, a sealing means 17 for sealing the thin film integrated circuits 13 with the second sheet member 19 and resin 55 which is squeezed in a state of being heated onto the surface of the thin film integrated circuits 13 opposite to the surface bonded to the second sheet member 19, and a receiving roller 20 for winding the sealed thin film integrated circuits 13. The structure illustrated in FIG. 3 is a structure as illustrated in FIG. 1 except that dye 54 and the resin 55 are substituted for the third supply roller 22 and the third sheet member 23.

The system illustrated in FIG. 3 can conduct processes in accordance with those illustrated in FIG. 1 up to peel the thin film integrated circuits 13 provided over the substrate 12 by the first sheet member 18, to bond the thin film integrated circuits 13 bonded to the first sheet member 18 to the second sheet member 19, and to move the thin film integrated circuits 13 bonded to the second sheet member 19 toward the sealing means 17. Thereafter, in FIG. 3, heated to be melted resin 55 is squeezed from dye 54 onto the first surface (surface opposite to the second surface bonded with the second sheet member). Then, the second sheet member 19 and the resin 55 introduced between a crimping roller 56 and a cooling roller 57 is cooled while applying pressure by the crimping roller 56 and the cooling roller 57 to bond the resin 55 to the first surface of the thin film integrated circuits 13, simultaneously, the thin film integrated circuits 13 are sealed with the second sheet member 19 and the resin 55. Lastly, the sealed thin film integrated circuits 13 is moved toward the receiving roller 20 to be winded and collected by the receiving roller 20.

In the structure of the laminating system illustrated in FIG. 3, thermoplastic resin is used as the resin 55. Thermoplastic resin having a low softening point is preferably used as the resin 55. For example, polyolefin resin such as polyethylene, polypropylene, or polymethylpentene; vinyl copolymer such as vinyl chloride, vinyl acetate, polyvinyl chloride acetate copolymer, ethylene-vinyl acetate copolymer, vinylidene chloride, polyvinyl butyral, or polyvinyl alcohol; acrylic resin; polyester resin; urethane resin; cellulosic resin such as cellulose, cellulose acetate, cellulose acetate butyrate, cellulose acetate propionate, or ethyl cellulose; styrene resin such as polystyrene or acrylonitrile-styrene copolymer can be nominated. The resin 55 may be a single layer squeezed from the dye 54, alternatively, two or more layers squeezed together from the dye 54. Further, any one of the foregoing materials can be used as the first sheet member 18 or the second sheet member 19.

As noted above, according to the laminating system illustrated in FIG. 3, a plurality of the thin film integrated circuits 13 provided over the substrate 12 can be continuously peeled, sealed, and collected by the spin of the transporting means 11, the first and second supply rollers 14, 15, the rollers 16, 24, and 28, the crimping roller 56, the cooling roller 57, and the receiving roller 20. Therefore, the system illustrated in FIG. 3 can improve mass productivity and manufacturing efficiency.

Figure 4:
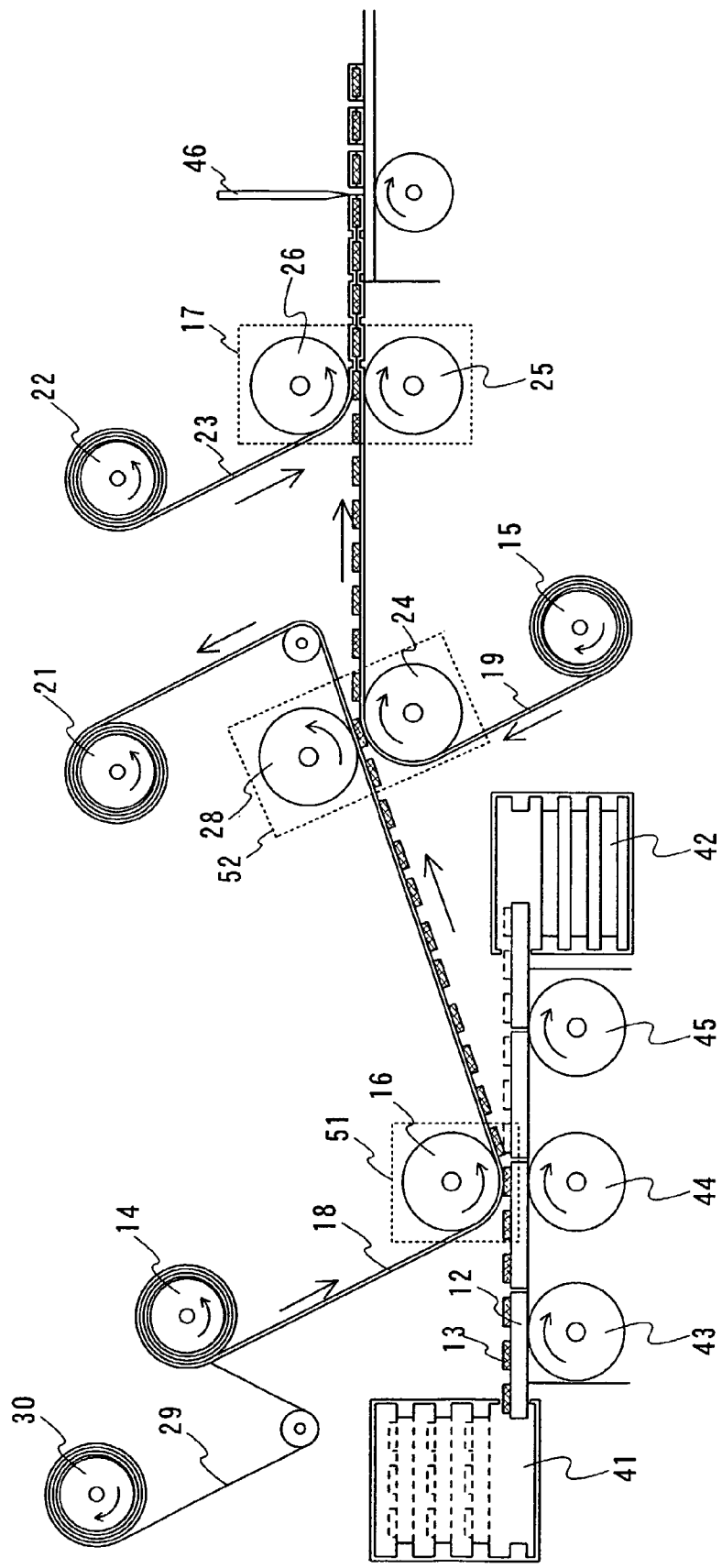
FIG. 4 is a view for showing a laminating system according to the present invention.

Then, an overall structure of the laminate system is explained with reference to FIG. 4. Here, the structure of laminate system including the structure illustrated in FIG. 1 is cited as an example for the explanation.

A cassette 41 is a cassette for supplying a substrate in which substrates 12 provided with a plurality of the thin film integrated circuits 13 are placed. The cassette 42 is a cassette for collecting a substrate, which collects the substrate 12 after separating from the thin film integrated circuits 13. A plurality of rollers 43 to 45 is provided between the cassette 41 and 42 as a transporting means. The substrate 12 is transported by the spin of the rollers 43 to 45. Thereafter, as noted above, the thin film integrated circuits 13 are peeled and sealed, and the sealed thin film integrated circuits 13 are cut by a cutting means 46. The cutting means 46 uses a dicing machine, scribing machine, a laser irradiation machine ($CO_2$ laser irradiation machine), or the like. The sealed thin film integrated circuits 13 are completed in accordance with the foregoing processes.

In the foregoing structure illustrated in FIGS. 1 to 3, the thin film integrated circuits 13 provided over the substrate 12 include an element group composed of a plurality of elements and a conductive layer serving as an antenna. However, the present invention is not restricted to the structure.

The thin film integrated circuits 13 provided over the substrate 12 may include only the element group. The conductive layer serving as an antenna is pasted onto the second sheet member 19 or the third sheet member 23, and a plurality of the elements included in the thin film integrated circuits 13 may be connected to the conductive layer when the thin film integrated circuits 13 are bonded to the second sheet member 19 or the third sheet member 23.

Embodiment 2

In this embodiment, the structure of an IC sheet (also referred to as an IC film, a sheet member, or a film member) is explained hereinafter.

As illustrated in FIG. 5, the IC sheet is a sheet formed by interposing to seal each of thin film integrated circuits 13 between two sheet members 19 and 23. The IC sheet is obtained by interposing to seal a plurality of thin film integrated circuits between the second sheet member 19 and the third sheet member 23 as shown in Embodiment 1.

Figure 5A:
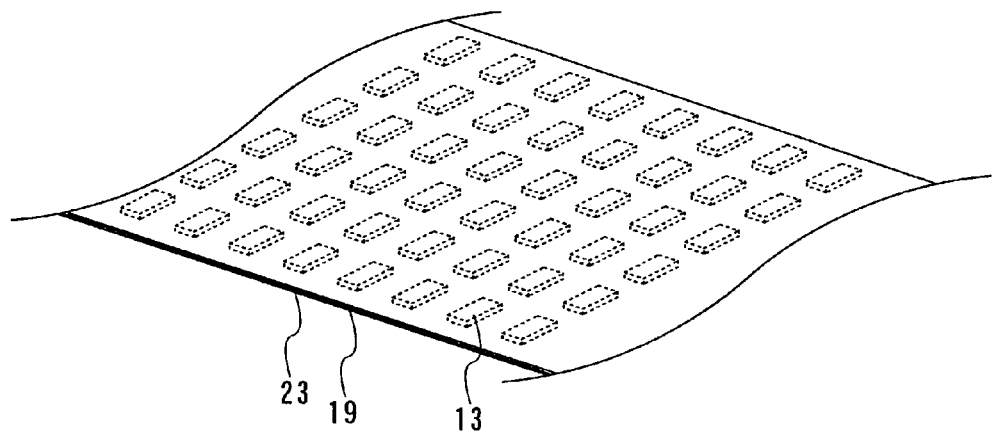
FIGS. 5A and 5B are views for showing an IC sheet according to the present invention.
Figure 5B:
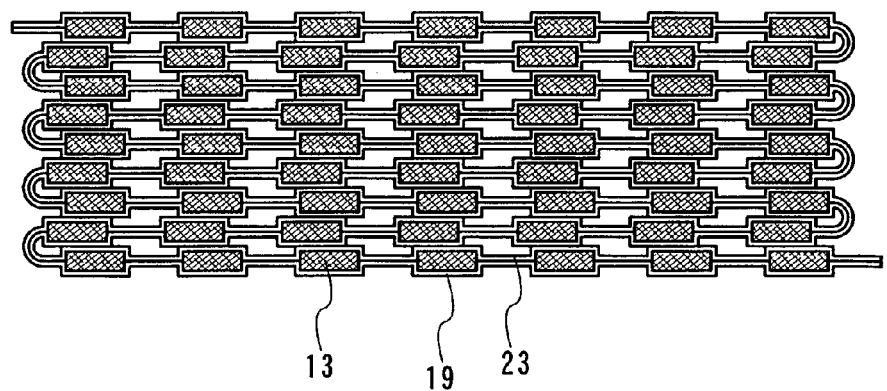

Each of the thin film integrated circuits 13 has a plurality of elements and a conductive layer serving as an antenna. Moreover, each of the thin film integrated circuits 13 can be regularly arranged to be a sheet by peeling effectively the thin film integrated circuits provided over the substrate (FIG. 5A). Further, one IC sheet may be rolling up in a roller or may be folded back on itself (FIG. 5B).

As noted above, it is easy to ship the sheet-like IC sheet including a plurality of the thin film integrated circuits 13 sealed with a pair of sheet members. Particularly, the IC sheet is effective in shipping in the case of manufacturing a large quantity of the thin film integrated circuits 13. A plurality of the thin film integrated circuits 13 cut in pieces has a difficulty in handling. The handling of the IC sheet according to this embodiment is easy since the IC sheet is formed to be sheet-like. In addition, the IC sheet according to this embodiment can protect the thin film integrated circuits 13 from being damaged and broken. When one wants to remove the thin film integrated circuits 13 individually from the IC sheet, the thin film integrated circuits 13 may be cut by a dicing machine, scribing machine, a laser irradiation machine ($CO_2$ laser irradiation machine), or the like.

This embodiment can be freely combined to the foregoing embodiments.

Embodiment 3

In this embodiment, the structure of a scroll of an IC sheet is explained hereinafter.

Figure 6A:
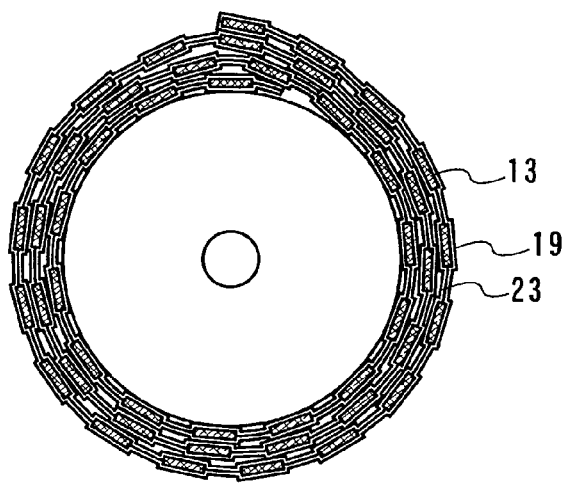
FIGS. 6A and 6B are views for showing a scroll of an IC sheet according to the present invention.

As illustrated in FIG. 6, the scroll of the IC sheet is formed by reeling a sheet member. Specifically, the scroll of the IC sheet is formed by reeling a plurality of thin film integrated circuits 13 which is interposed to be sealed between two sheet members 19 and 23 to be a roll. As described in Embodiment 1, the scroll of the IC sheet is obtained by reeling by a roller to collect the sheet-like plurality of thin film integrated circuits 13 sealed with a second sheet member 19 and a third sheet member 23. Each of the thin film integrated circuits 13 has a plurality of elements and a conductive layer serving as an antenna. Moreover, each of the thin film integrated circuits 13 is regularly arranged.

Figure 6B:
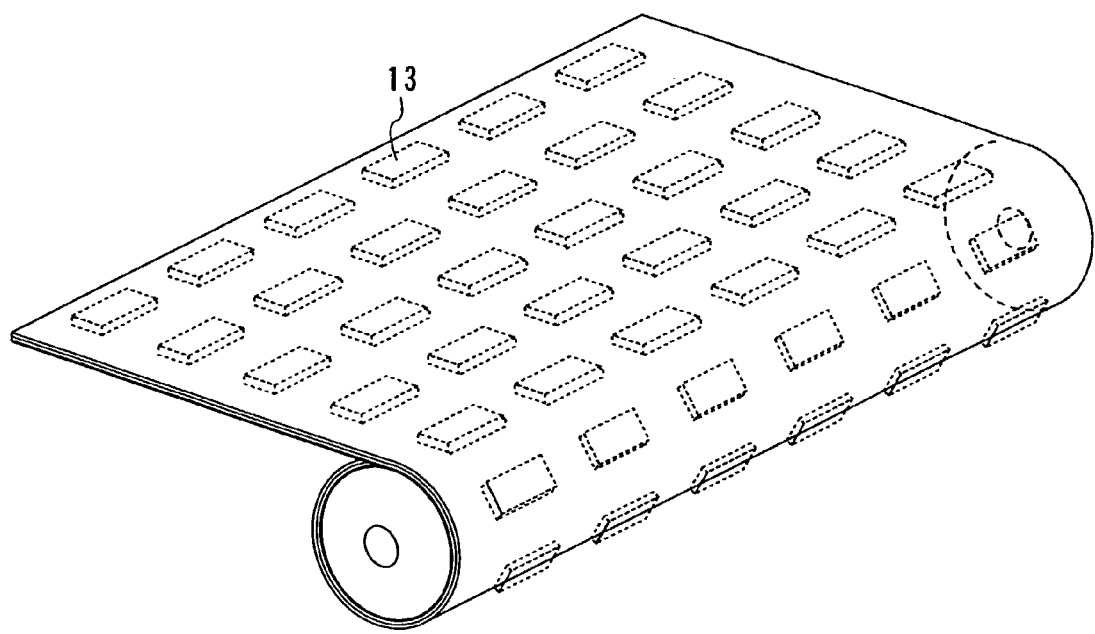

As noted above, it is easy to ship the scroll of the IC sheet formed by reeling the thin film integrated circuits 13 sealed with a pair of sheet members. Particularly, the scroll of the IC sheet is effective in shipping in the case of manufacturing a large quantity of the thin film integrated circuits 13. Generally, a plurality of the thin film integrated circuits 13 cut in pieces has a difficulty in handling. The handling of the scroll of the IC sheet according to this embodiment is easy since the IC sheet is reeled to be a scroll. For example, the thin film integrated circuits 13 can be used in a state as illustrated in FIG. 6B. In addition, the IC sheet according to this embodiment can protect the thin film integrated circuits 13 from being damaged and broken by using in such a way as noted above.

This embodiment can be freely combined to the foregoing embodiment.

Embodiment 4

In this embodiment, a method for manufacturing an IC chip according to the present invention is explained hereinafter with reference to the drawings.

A peeling layer 101 is formed on a substrate 100 (FIG. 7A). As the substrate 100, a glass substrate such as barium borosilicate glass or alumino-borosilicate glass, a quartz substrate, a ceramic substrate, or the like can be used. A semiconductor substrate such as a metal substrate including stainless or a silicon substrate over which an insulating film is formed can be used. A substrate made from synthetic resin such as plastic having flexibility has generally a lower allowable temperature limit than that of the foregoing substrate; however it can be used only in the case that it can resist processing temperature in a manufacturing process. The surface of the substrate 100 may be smoothed by polishing such as a CMP method. When using the silicon substrate, the peeling layer 101 is not required to be provided.

The peeling layer 101 is formed by forming a layer containing silicon by a sputtering method, a plasma CVD, or the like. The layer containing silicon corresponds to an amorphous semiconductor film including silicon, a semiamorphous semiconductor film which is a mixture of an amorphous state and a crystalline state, a crystalline semiconductor film, or the like. As the peeling layer 101, a film containing metal can be used. For example, as a metal film and a metal oxide film, W and WOx, Mo and MoOx, Nb and NbOx, Ti and TiOx (x=2, 3), or the like can be formed respectively. Here, the peeling layer 101 is formed all over the substrate 100; alternatively, it may be formed selectively on the substrate 100.

The peeling layer 101 is formed directly on the substrate 100 in this embodiment. A base film can be formed between the substrate 100 and the peeling layer 101. The base film may be a single layer structure or a laminate layer structure of an insulating film containing oxygen or nitrogen such as silicon oxide (SiOx), silicon nitride (SiNx), silicon oxynitride (SiOxNy) (x>y), or silicon nitride oxide (SiNxOy) (x<y) (x, y=1, 2 . . . ). Particularly, in the case that there is fear that the substrate is contaminated, the base film is preferably formed between the substrate 100 and the peeling layer 101.

An insulating film 102 as a base film is formed over the peeling layer 101. The insulating film 102 can be formed to have a single layered structure or a laminate layered structure. For example, the insulating film may be formed to have a laminated layered structure composed of three layers, for example, a silicon oxide film as a first insulating film, a silicon nitride oxide film as a second insulating film, and a silicon oxynitride film as a third insulating film.

An element group 103 is formed over the insulating film 102. As the element group 103, for example, one or a plurality of thin film transistors, capacitor elements, resistance elements, diodes, or the like. FIG. 7 illustrates that a thin film transistor having a GOLD structure is formed as the element group 103; however, the thin film transistor may be formed to have an LDD structure by forming a side wall at the side face of a gate electrode.

An insulating film 104 is formed so as to cover the element group 103. An insulating film 105 is formed over the insulating film 104. Then, a conductive layer 106 serving as an antenna is formed over the insulating film 105. Thereafter, an insulating film 107 serving as a protective film is formed over the conductive layer 106. After performing the foregoing processes, thin film integrated circuits 108 including the element group 103 and the conductive layer 106 are completely manufactured.

An inorganic insulating film or an organic insulating film can be used for the insulating films 104, 105, and 107. As the inorganic insulating film, a silicon oxide film or a silicon oxynitride film formed by a CVD method or a silicon oxide film coated by an SOG (Spin On Glass) method. As the organic insulating film, a film made from polyimide, polyamide, BCB (benzocyclobutene), acrylic, positive type photosensitive organic resin, negative type organic resin, or the like can be used. A laminated structure of an acrylic film and a silicon oxynitride film can be used.

The insulating films 104, 105, and 107 can be formed by siloxane resin. The siloxane resin corresponds to resin including a Si—O—Si bond. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

The siloxane resin can be classified into silica glass, alkylsiloxane polymer, alkylsilsesquioxane polymer, hydrogenated silsesquioxane polymer, hydrogenated alkylsiloxane polymer, and the like. An interlayer insulating film can be formed by a material containing polymer (polysilazane) having a Si—N bond.

Figure 10A:
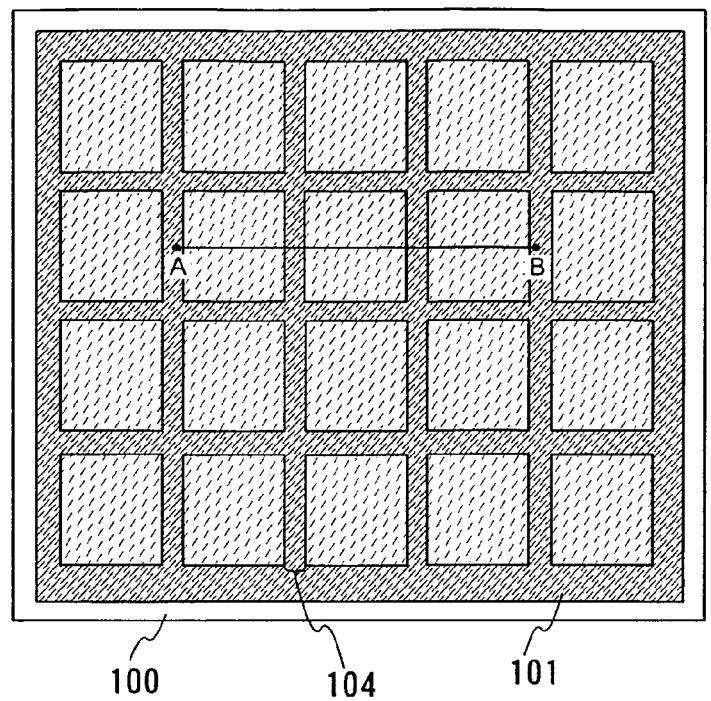
FIGS. 10A and 10B are views for showing a peeling method according to the present invention.

Opening portions 111, 112 are formed so that the peeling layer 101 is exposed between the thin film integrated circuits 108 (FIG. 7B). The opening portions 111, 112 are formed by etching or dicing with a mask. FIG. 10A is a top view for showing this state. The cross-sectional view in FIGS. 7A to 7C corresponds to FIG. 10A taken along line A-B.

Figure 10B:
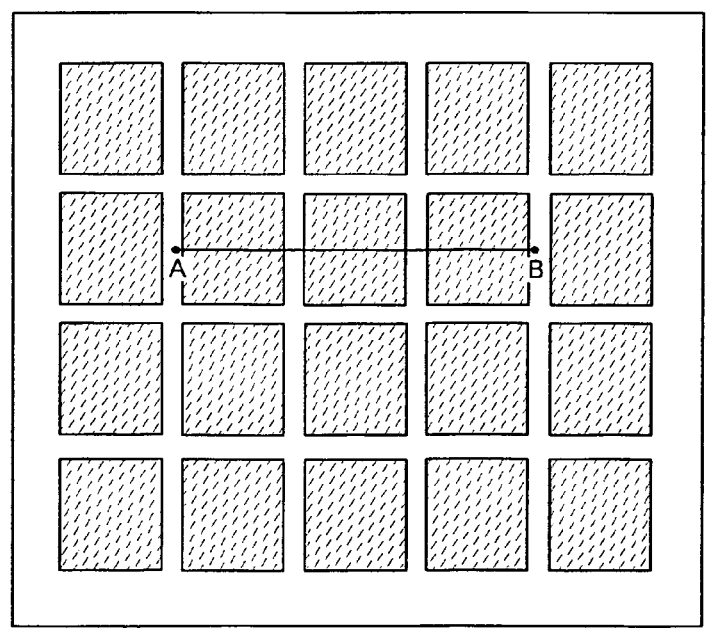

An etching agent for removing the peeling layer 101 is introduced into the opening portions 111, 112 to remove the peeling layer gradually except parts of the peeling layer 113 to 115 (FIGS. 7C and 10B). As the etching agent, gas or liquid containing halogen fluoride is used. For example, halogen trifluoride (ClF$_3$) is used as halogen fluoride.

As noted above, the peeling layer 101 is not completely removed in this process to leave the parts of the peeling layer 113 to 115 located below the thin film integrated circuits 108. Accordingly, the thin film integrated circuits 108 can be prevented from dispersing to be scattered, which leads to keep the arrangement as before being peeled even after being peeled. In the case that there is no fear of dispersing the thin film integrated circuits 108, peeling can be carried out after removing the peeling layer 101 completely.

First surfaces of the thin film integrated circuits 108 are bonded to a first sheet member 116. Accordingly, the thin film integrated circuits 108 are peeled from the substrate 100 (FIG. 8A). As noted above, in the case that the thin film integrated circuits 108 are physically peeled from the substrate 100 while leaving the parts 113 to 115 of the peeling layer 101, a metal film is preferably formed over the peeling layer 101. For example, in the case of using W or Mo as a peeling layer, a silicon oxide film is formed over the W or Mo, and WOx or MoOx is respectively formed over the W or Mo by heat treatment or the like. By forming the metal oxide film, the peeling layer becomes easily to be peeled from the silicon oxide film, and the substrate and the thin film integrated circuit can be easily separated without removing completely the peeling layer. Further, the first sheet member 116 is formed by a flexible film, and an adhesive agent is provided to at least a surface of the first sheet member 116 which is in contact with the thin film integrated circuits 108. For example, a film formed by forming a film provided with an adhesive agent having poor adhesion containing acrylic resin over a base film made from polyester or the like can be used.

Second surfaces of the thin film integrated circuits 108 are bonded to the second sheet member 117 to peel the thin film integrated circuits 108 from the first sheet member 116 (FIG. 8B).

A third sheet member 118 is bonded to the surface of the thin film integrated circuits 108 opposite to the surface bonded with the second sheet member 117, simultaneously, the thin film integrated circuits 108 are sealed with the second sheet member 117 and the third sheet member 118 (FIG. 8C). Accordingly, the thin film integrated circuits 108 are sealed with the second sheet member 117 and the third sheet member 118. The second sheet member 117 and the third sheet member 118 are formed by flexible films such as laminate films. Specifically, a hot melt film formed over a base film such as polyester can be used. Either or both of pressure treatment and heat treatment is carried out when bonding the second sheet member 117 and the third sheet member 118 to the thin film integrated circuits 108, which can make it possible to bond the thin film integrated circuits 108 in a short time.

The second sheet member 117 and the third sheet member 118 are cut selectively between the thin film integrated circuits 108 by dicing, scribing, or a laser cut method. Accordingly, a sealed IC chip is completely manufactured (FIGS. 9A and 9B).

The sealed IC chip completed through the foregoing processes has a size of 5 mm square (25 mm$^2$) or less, preferably, 0.3 mm square (0.09 mm$^2$) to 4 mm square (16 mm$^2$).

Since the chip according to the present invention in the case of not using a silicon substrate uses a thin film integrated circuits formed over an insulating substrate, there are no constraints on the shape of a mother substrate unlike a chip formed from a circular silicon substrate. Accordingly, the productivity of the chip can be improved, and so mass production can be realized. The peeled substrate can be reused in the above process. The costs for manufacturing a thin film integrated circuit using a substrate such as glass can be reduced. For example, there is a problem of high prime costs of a quartz substrate despite its advantages in flatness and high heat resistance. Reusing the substrate leads to the reduction of the costs even in the case of using the quartz substrate which costs more than the glass substrate. In this embodiment, a thin film integrated circuit is formed over the quartz substrate, and the thin film integrated circuit is peeled, then, the quartz substrate is reused. Therefore, a thin film integrated circuit having higher characteristics can be manufactured at low costs.

Since the IC chip explained in this embodiment uses a semiconductor film having a thickness of 0.2 μm or less, typically, 40 to 170 nm, preferably, 50 to 150 nm as an active region, the IC chip is formed to be extremely thin shaped. As a result, tampering can be prevented since the thin film integrated circuits are hardly recognized in the state of being mounted to an article. Further, there is no fear of radio wave absorption, and so a high-sensitive signal can be received unlike an IC chip formed by a silicon substrate. The thin film integrated circuit which does not have a silicon substrate has a light transmitting property. Consequently, the thin film integrated circuit can be used for various articles. For example, the thin film integrated circuits can be mounted to a print surface of an article, which does not detract from the design of the article.

This embodiment can be freely combined to the foregoing embodiments.

EXAMPLE 1

In this example, a method for manufacturing a gate electrode in a method for manufacturing an ID chip explained in the foregoing Embodiments is explained with reference to FIGS. 15A to 16B. If not otherwise specified, the gate electrode can be manufactured by using the same material as that described in Embodiments.

Firstly, a peeling layer 201 is formed over a substrate 200 to provide semiconductor films 211, 212 via insulating layers 202, 203. Further, a gate insulating film 213 is formed over the semiconductor films 211, 212. Thereafter, a first conductive layer 951 and a second conductive layer 952 are stacked over the gate insulating film 213. In this example, tantalum nitride (TaN) is used for the first conductive layer and tungsten (W) is used for the second conductive layer. The TaN film may be formed by a sputtering method using a target of tantalum in a nitrogen atmosphere. The W film may be formed by a sputtering method using a target of tungsten.

In this example, the first conductive layer 951 is made from TaN and the second conductive layer 952 is made from W. However, the materials for the first conductive layer 951 and the second conductive layer 952 are not restricted to the TaN and the W. Elements selected from Ta, W, Ti, Mo, Al, Cu, Cr, and Nd; an alloy material or a compound material, each of which contains mainly the foregoing elements, can be used. Alternatively, a semiconductor film as typified by a polycrystalline silicon film doped with an impurity element such as phosphorus. Further alternatively, AgPdCu alloys can be used. Combinations of the conductive layers can be appropriately selected. The first conductive layer 951 may be formed to have a thickness in the range of from 20 to 100 nm. The second conductive layer 952 may be formed to have a thickness in the range of from 100 to 400 nm. In this example, the conductive layers are formed to have a laminated structure of two layers. Alternatively, a single layered conductive layer may be formed, or the conductive layers may be formed to have a laminated structure of three or more layers.

Figure 15A:
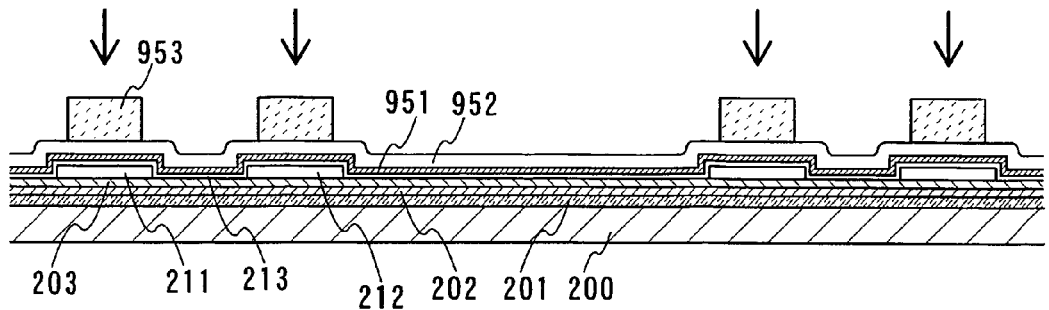
FIGS. 15A and 15B are views for showing a cross-structure of an IC chip according to the present invention.
Figure 15B:
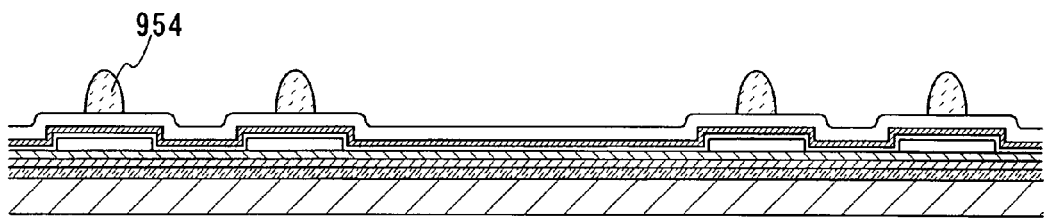

Then, resist 953 is selectively formed over the second conductive layer 952 by a photolithography method or a droplet discharging method (FIG. 15A). Thereafter, the resist 953 is etched by known etching treatment such as $O_2$ (oxygen) plasma to reduce the size of the resist 953 (FIG. 15B). When etching the first conductive layer 951 and the second conductive layer 952 using the reduced resist 954 as a mask, a gate electrode having a further reduced width can be formed. That is, a gate electrode having a further smaller width can be formed than that of a gate electrode formed by using a resist 953 which is obtained by usual patterning. In such a way, the width of a channel formation region is reduced by reducing the size of a gate electrode structure. Accordingly, a high speed operation becomes possible.

Figure 16A:
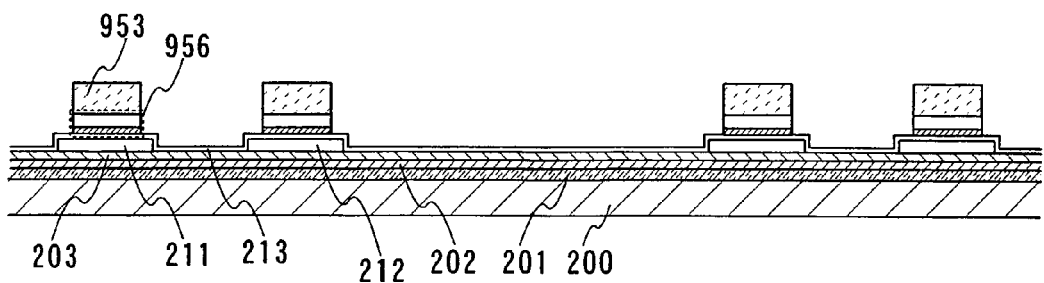
FIGS. 16A and 16B are views for showing a cross-structure of an IC chip according to the present invention.
Figure 16B:
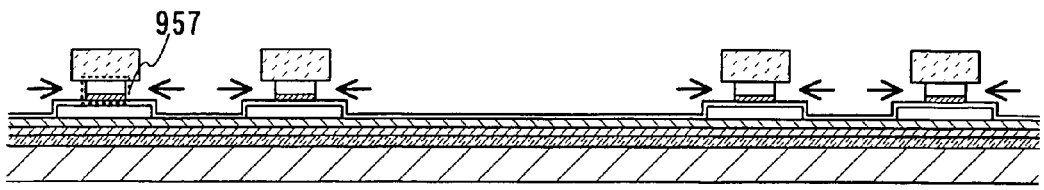

A method for manufacturing a gate electrode which is different from that illustrated in FIGS. 15A and 15B is explained with reference to FIGS. 16A and 16B.

As shown in FIG. 15A, the peeling layer 201, the insulating films 202, 203, the semiconductor films 211, 212, the gate insulating film 213, the first conductive layer 951, and the second conductive layer 952 are staked. Then, the resist 953 is selectively formed. And then, the first conductive layer 951 and the second conductive layer 952 are etched using the resist 953 as a mask (FIG. 16A). According to the process, a gate electrode 956 is formed by the first conductive layer 951 and the second conductive layer 952. Thereafter, the gate electrode 956 is etched by an etching method. Since the resist 953 is provided over the gate electrode 956, the sides of the gate electrode 956 are etched; accordingly, a gate electrode 957 having a smaller width than that of the gate electrode 956 can be formed as shown in FIG. 16B.

According to the manufacturing method explained in this example, a small gate electrode having the size over the limit of patterning by a photolithography method or the like can be manufactured. By minimizing the gate electrode, smaller element structure can be provided. Accordingly, more elements can be formed, and so a circuit having high performance can be formed. Further, a thin film integrated circuit (IC chip or the like) can be miniaturized in the case that the thin film integrated circuit is formed to have the same numbers of elements as before. The method illustrated in FIGS. 15A and 15B and the method illustrated in FIGS. 16A and 16B can be combined to form further small gate electrode.

This example can be implemented by freely combining to the foregoing Embodiments.

EXAMPLE 2

Figure 14:
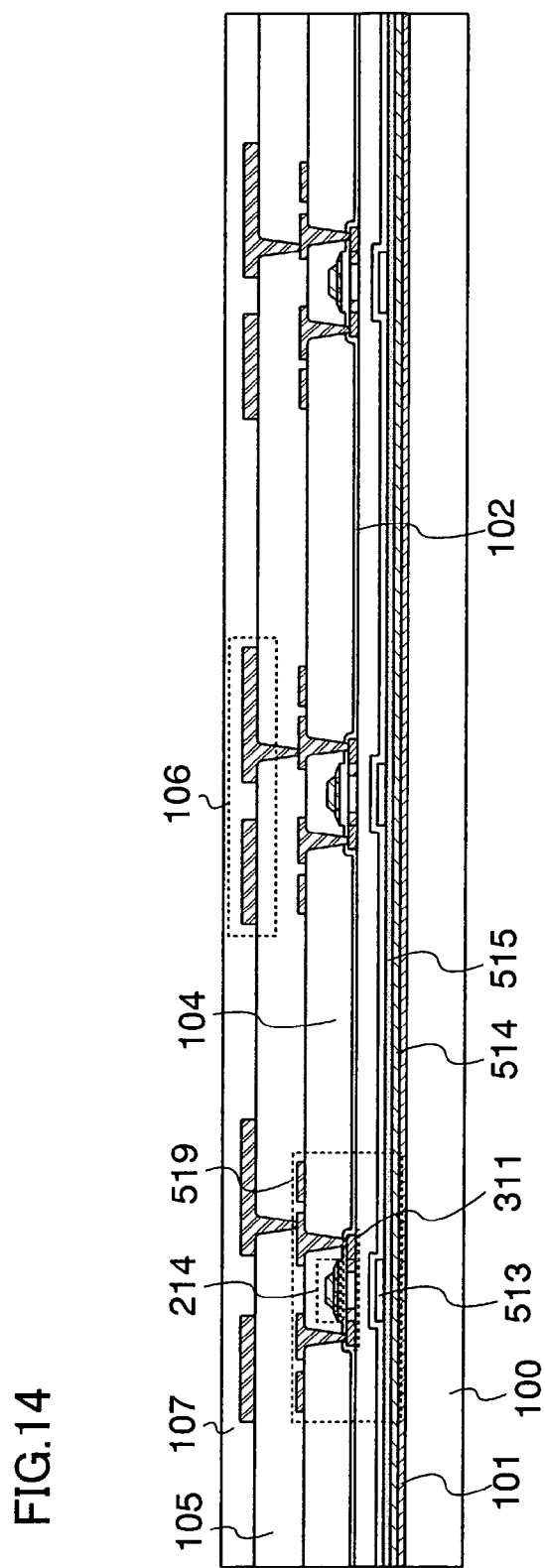
FIG. 14 is a view for showing a cross-structure of an IC chip according to the present invention.

In this example, the structure of a TFT layer 102 which is different from that described in Example 1 with reference to FIG. 14.

FIG. 14 shows a structure which is the structure of an element structure 103 in FIG. 7A added with a bottom electrode. That is, as shown in FIG. 14, a structure 519 including a channel region of a semiconductor film 311 interposed between the bottom electrode 513 and a gate electrode 214 via an insulating film.

The bottom electrode 513 can be formed by metal or a polycrystalline semiconductor added with an impurity of one conductivity type. In case of using metal, W, Mo, Ti, Ta, Al or the like can be used. Further, a silicon nitride film 514 and a silicon oxynitride film 515 which serve as base insulating films are formed. The materials and the lamination order of the silicon nitride film 514 and the silicon oxynitride film 515 are not restricted to those as described herein.

As noted above, a TFT having a bottom electrode can be used as the structure of the TFT layer 102. Generally, when the size of the TFT is reduced and a clock frequency for operating a circuit is improved, power consumption of an integrated circuit is increased. Therefore, a method of applying a bias voltage to the bottom electrode is useful in deterring the increase of the power consumption. By varying the bias voltage, a threshold voltage of the TFT can be varied.

Applying a minus bias voltage to the bottom electrode of an n-channel TFT increases a threshold voltage with a decrease in leakage. On the other hand, applying a plus bias voltage decreases the threshold voltage, which leads to easier flow of current through the channel and operation of the TFT at high speed or at low voltage. Further, applying a plus bias voltage to the bottom electrode of a p-channel TFT increases a threshold voltage with a decrease in leakage. On the other hand, applying a minus voltage decreases the threshold voltage, which leads to easier flow of current through the channel and operation of the TFT at high speed or at low voltage. By controlling a bias voltage for applying to the bottom electrode, the characteristics of an integrated circuit can be drastically improved.

By balancing the threshold voltage of the n-channel TFT and the p-channel TFT with the bias voltage, the characteristics of an integrated circuit can be improved. In that case, both of a power source voltage and the bias voltage for applying to the bottom electrode can be controlled in order to reduce power consumption. When the circuit is in a standby mode, a large reverse direction bias voltage is applied to the bottom electrode. In operation, a weak reverse direction bias voltage is applied to the bottom electrode when load is small, whereas a weak forward bias voltage is applied when the load is large. The application of the bias voltage may be made be capable of being switched depending on the state of operation or load of the circuit by providing a control circuit. By controlling power consumption or TFT performance in such a way, circuit performance can be maximized.

This example can be freely combined to the foregoing Embodiments and Examples.

EXAMPLE 3

In this example, the structure of an IC chip manufactured by a manufacturing method according to the present invention is explained.

Figure 11A:
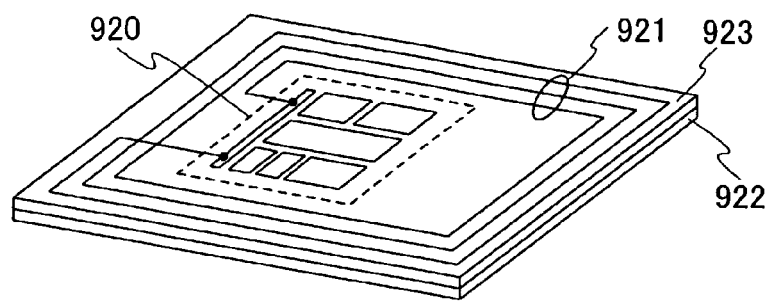
FIGS. 11A and 11B are views for showing a top view of an IC chip according to the present invention.

FIG. 11A is a perspective view of one form of an IC chip. Reference numeral 920 denotes an integrated circuit and 921 denotes an antenna. The antenna 921 is electrically connected to the integrated circuit 920. Reference numeral 922 denotes a substrate and 923 denotes a cover member. The integrated circuit 920 and the antenna 921 are sandwiched between the substrate 922 and the cover member 923.

Figure 11B:
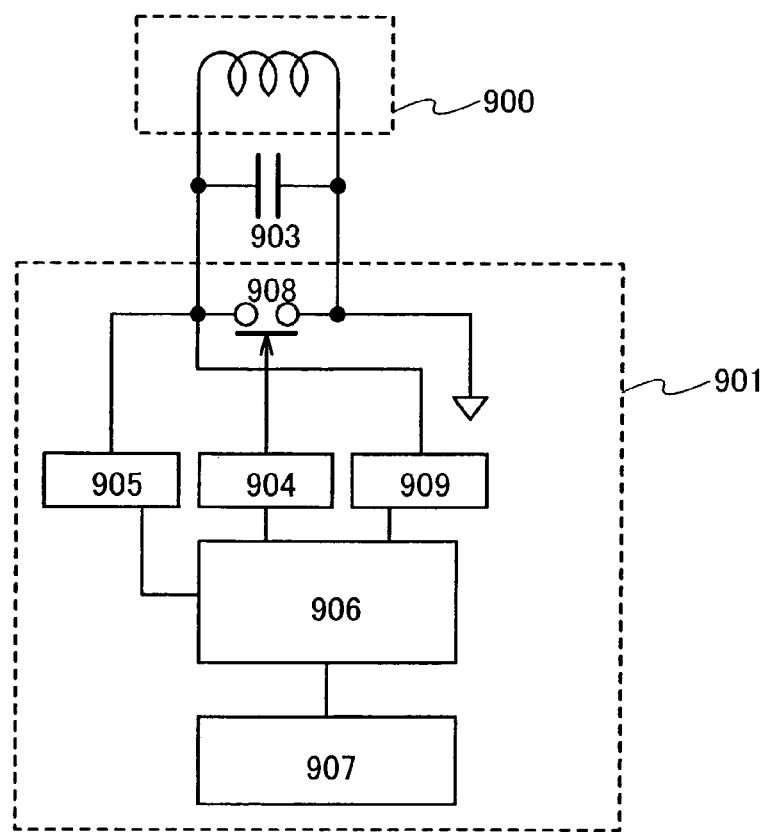

FIG. 11B shows one form of a functional structure of the IC chip illustrated in FIG. 11A.

In FIG. 11B, reference numeral 900 denotes an antenna; 901, an integrated circuit; and 903, a capacity formed between terminals of the antenna 900. The integrated circuit 901 has a demodulation circuit 909, a modulation circuit 904, a rectification circuit 905, a microprocessor 906, a memory 907, and a switch 908 for giving load modulation to the antenna 900. There may be more than one memory 907. A plurality of memories such as an SRAM, a flash memory, a ROM, an FRAM (registered trademark), and the like can be used.

A signal sent from a reader/writer as an electric wave is converted into an alternating electric signal by electromagnetic induction in the antenna 900. The demodulation circuit 909 demodulates the alternating electric signal to send it to the microprocessor 906 in a subsequent stage. The rectification circuit 905 generates power source voltage by the alternating electric signal to supply it to the microprocessor 906 in the subsequent stage. The microprocessor 906 carries out various kinds of arithmetic processing according to an inputted signal. The memory 907 stores a program and data used in the microprocessor 906. The memory 907 can be used as a working area in the arithmetic processing.

When data is sent from the microprocessor 906 to the modulation circuit 904, the modulation circuit 904 can control the switch 908 to apply load modulation to the antenna 900 according to the data. As a result, the reader/writer can read out the data from the microprocessor 906 by receiving the load modulation given to the antenna 900.

The IC chip does not always have to have the microprocessor 906. The transmission system of a signal is not restricted to the foregoing electromagnetic coupling system as shown in FIG. 11B. The electromagnetic system, a microwave system, or another transmission system can be used.

Since an IC chip having an antenna can transmit external information, the IC chip can be used as a wireless memory or a wireless processor.

This example can be freely combined to the foregoing Embodiments and Examples.

EXAMPLE 4

Figure 12A:
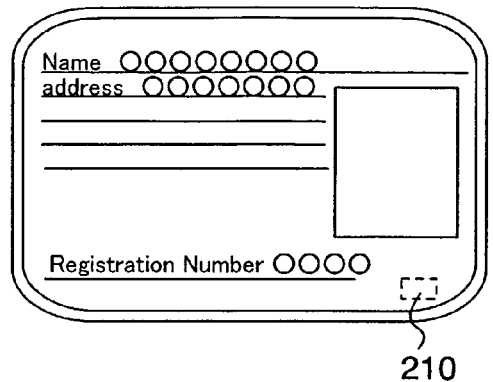
FIGS. 12A to 12E are views for showing articles mounted with thin film integrated circuits according to the present invention.
Figure 12B:
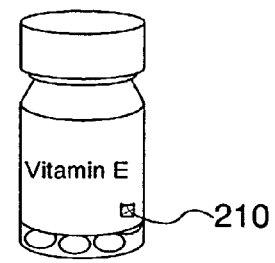
Figure 12C:
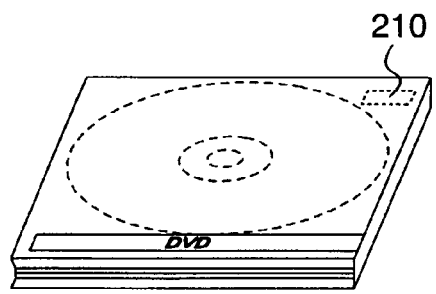
Figure 12D:
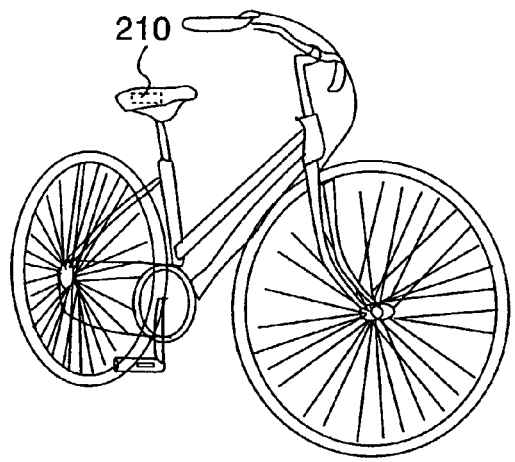
Figure 12E:
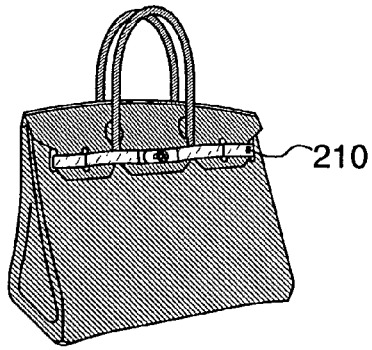

In this example, the usage of a thin film integrated circuit described in the foregoing Embodiment or Examples is explained. The thin film integrated circuit peeled from a substrate can be used as an IC chip 210, for example, paper money, coins, securities, bearer bonds, certificates (driver's license, resident card, and the like, refers to FIG. 12A), packing containers (wrapping paper, bottle, and the like, refers to FIG. 12B), recording media such as a DVD software, a CD, or a video tape (FIG. 12C), vehicles such as a car, a motorbike, or a bicycle (FIG. 12D), commodities such as a bag or glasses (FIG. 12E), foods, garments, consumption goods, electric appliances, and the like. The electric appliance indicates a liquid crystal display device, an EL display device, a television apparatus (referred to as a television or television set), a cellular phone, and the like.

The IC chip can be fixed to an article by pasting onto the surface of the article or embedding in the article. For example, the IC chip may be embedded in a paper of a book or in organic resin of a package made from the organic resin. Counterfeiting can be prevented by providing the IC chip to paper money, coins, securities, bearer bonds, certificates. An inspection system or a system used in a rental shop can be made more efficient by providing the IC chip to packing containers, recording media, commodities, foods, garments, consumption goods, electric appliances, and the like. Imitation or theft can be prevented by providing the IC chip to vehicles.

Figure 13A:
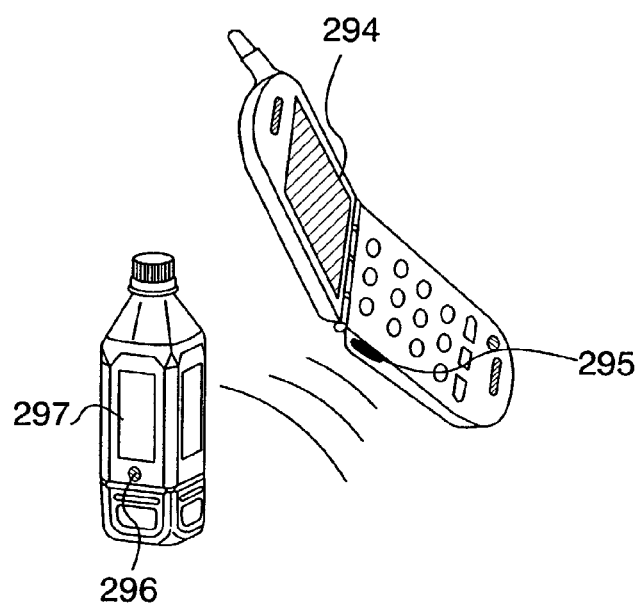
FIGS. 13A and 13B are views for showing articles mounted with thin film integrated circuits according to the present invention.
Figure 13B:
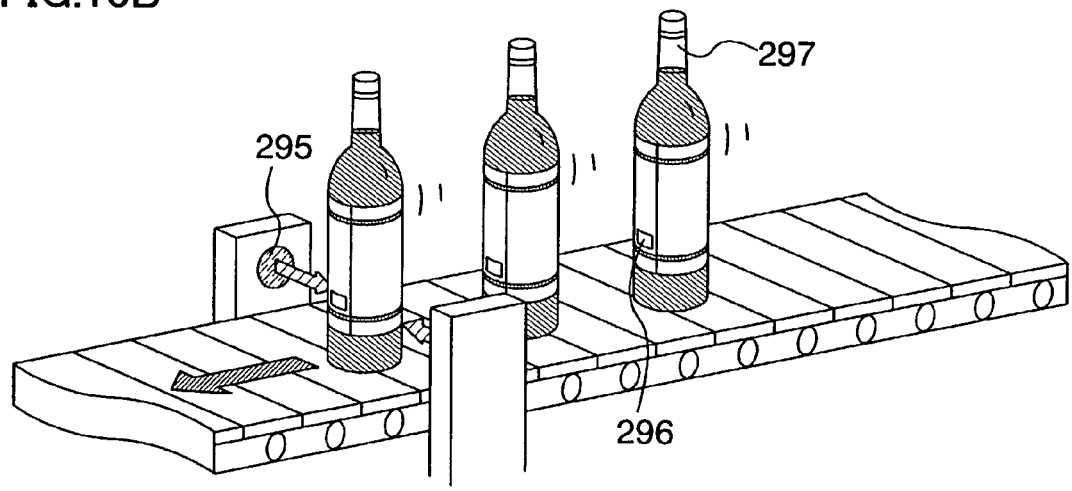

By applying the IC chip to a system for management or distribution of goods, the system can be made sophisticated. For example, as shown in FIG. 13A, the case that a reader/writer 295 is provided to the side face of a portable terminal having a display portion 294 and the case that an IC chip 296 is provided to the side face of an article 297 (FIG. 13A) are taken as an example. In that case, when the IC chip 296 is held over the reader/writer 295, information on the raw material, the place of origin, and the history of a distribution process of the article 297 is displayed on the display portion 294. As another example, in the case that the reader/writer 295 is provided beside a belt conveyor, inspection of the article 297 provided with the IC chip 296 can be easily carried out (FIG. 13B).

This example can be implemented by combining freely with the foregoing Embodiments and Examples.

The invention claimed is:

1. A laminating system comprising:
   transporting means for transporting a glass substrate provided with a plurality of thin film integrated circuits;
   a first supply roller wounded with a first sheet member;
   first peeling means for bonding first surfaces of the plurality of thin film integrated circuits to the first sheet member to peel the plurality of thin film integrated circuits from the glass substrate;
   a second supply roller wounded with a second sheet member provided with an antenna;
   second peeling means for bonding second surfaces opposed to the first surfaces of the plurality of thin film integrated circuits to the second sheet member to peel the plurality of thin film integrated circuits from the first sheet member;
   a third supply roller wounded with a third sheet member;
   sealing means for interposing the plurality of thin film integrated circuits between the second sheet member and the third sheet member; and
   a receiving roller for winding the plurality of thin film integrated circuits which are sealed with the second sheet member and the third sheet member.

2. A laminating system comprising:
   a glass substrate provided with a plurality of thin film integrated circuits;
   a first supply roller wounded with a first sheet member;
   fixating and moving means for fixating the glass substrate so that one surface of the glass substrate is opposite to the first sheet member and for moving the glass substrate so that the plurality of thin film integrated circuits and the first sheet member are bonded together;
   first peeling means for bonding first surfaces of the plurality of thin film integrated circuits to the first sheet member to peel the plurality of thin film integrated circuits from the glass substrate;
   a second supply roller wounded with a second sheet member provided with an antenna;
   second peeling means for bonding second surfaces opposed to the first surfaces of the plurality of thin film integrated circuits to the second sheet member to peel the plurality of thin film integrated circuits from the first sheet member;
   a third supply roller wounded with a third sheet member which bonds to the first surfaces of the plurality of thin film integrated circuits;
   sealing means for sealing the plurality of thin film integrated circuits with the second sheet member and the third sheet member; and
   a receiving roller for winding the plurality of thin film integrated circuits which are sealed with the second sheet member and the third sheet member.

3. A laminating system comprising:
   transporting means for transporting a glass substrate provided with a plurality of thin film integrated circuits;
   a first supply roller wounded with a first sheet member;
   first peeling means for bonding first surfaces of the plurality of thin film integrated circuits to the first sheet member to peel the plurality of thin film integrated circuits from the glass substrate;
   a second supply roller wounded with a second sheet member provided with an antenna;
   second peeling means for bonding second surfaces opposed to the first surfaces of the plurality of thin film integrated circuits to the second sheet member to peel the plurality of thin film integrated circuits from the first sheet member;
   means for supplying resin in a heated and melted state by squeezing onto the first surfaces of the plurality of thin film integrated circuits;
   sealing means for sealing the plurality of thin film integrated circuits with the second sheet member and the resin; and
   a receiving roller for winding the plurality of thin film integrated circuits which are sealed with the second sheet member and the resin.

4. The laminating system according to any one of claims 1 to 3, wherein the sealing means has two rollers provided so as to be opposed to each other.

5. The laminating system according to claim 1 or 2, wherein the sealing means has two rollers provided so as to be opposed to each other, and either or both of the two rollers has a heating means.

6. The laminating system according to claim 1 or 2, wherein the sealing means has two rollers provided so as to be opposed to each other, passes the plurality of thin film integrated circuits through the two rollers, and seals the plurality of thin film integrated circuits by performing either or both of a pressure treatment and a heating treatment.

7. The laminating system according to claim 3, wherein the sealing means has two rollers provided so as to be opposed to each other, and either or both of the two rollers has a cooling means.

8. The laminating system according to claim 3, wherein the sealing means has two rollers provided so as to be opposed to each other, passes the plurality of thin film integrated circuits through the two rollers, and seals the plurality of thin film integrated circuits by performing either or both of a pressure treatment and a heating treatment.

9. The laminating system according to any one of claims 1 to 3, wherein the first peeling means and the second peeling means have rollers.

10. The laminating system according to any one of claims 1 to 3, wherein the second peeling means has two rollers so as to be opposed to each other.

11. The laminating system according to any one of claims 1 to 3, wherein the second peeling means has two rollers so as to be opposed to each other, and either or both of the two rollers has a heating means.

12. The laminating system according to any one of claims 1 to 3, wherein the second peeling means has two rollers so as to be opposed to each other, passes the plurality of thin film integrated circuits through the two rollers, and peels the plurality of thin film integrated circuits from the first sheet member to be transferred to the second sheet member by performing either or both of a pressure treatment and a heating treatment.

13. The laminating system according to any one of claims 1 to 3, wherein the first sheet member has at least one side with an adhesive property.

14. The laminating system according to claim 1 or 2, wherein the second sheet member and the third sheet member are laminate films.

* * * * *